US009570185B2

(12) United States Patent
Mokhlesi

(10) Patent No.: US 9,570,185 B2
(45) Date of Patent: Feb. 14, 2017

(54) DYNAMIC ADJUSTMENT OF READ VOLTAGE LEVELS BASED ON MEMORY CELL THRESHOLD VOLTAGE DISTRIBUTION

(71) Applicant: SANDISK TECHNOLOGIES INC., Plano, TX (US)

(72) Inventor: Nima Mokhlesi, Los Altos, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/726,301

(22) Filed: May 29, 2015

(65) Prior Publication Data

US 2015/0380096 A1 Dec. 31, 2015

Related U.S. Application Data

(62) Division of application No. 13/743,563, filed on Jan. 17, 2013, now Pat. No. 9,076,545.

(51) Int. Cl.
G11C 16/34 (2006.01)
G11C 16/26 (2006.01)
G11C 11/56 (2006.01)
G11C 16/28 (2006.01)

(52) U.S. Cl.
CPC .......... *G11C 16/26* (2013.01); *G11C 11/5642* (2013.01); *G11C 16/28* (2013.01); *G11C 16/3454* (2013.01); *G11C 16/3459* (2013.01)

(58) Field of Classification Search
CPC ............ G11C 16/3454; G11C 16/3459; G11C 11/5628

USPC ....................................... 365/185.22, 185.21
See application file for complete search history.

(56) References Cited

U.S. PATENT DOCUMENTS

| | | |
|---|---|---|
| 5,386,422 A | 1/1995 | Endoh |
| 5,570,315 A | 10/1996 | Tanaka |
| 5,761,125 A | 6/1998 | Himeno |
| 5,774,397 A | 6/1998 | Endoh |
| 5,920,501 A | 7/1999 | Norman |
| 5,963,473 A | 10/1999 | Norman |
| 6,031,763 A | 2/2000 | Sansbury |
| 6,046,935 A | 4/2000 | Takeuchi |
| 6,222,762 B1 | 4/2001 | Guterman |

(Continued)

FOREIGN PATENT DOCUMENTS

WO WO2014113588 7/2014

OTHER PUBLICATIONS

Cha et al., "Application of a negative sweep voltage to control gate of fresh flash memory devices to facilitate threshold voltage test measurement," Proc. of the 1998 IEEE 6th Int. Conf. on Conduction and Breakdown in Solid Dielectrics, 1998, pp. 253-256.

(Continued)

*Primary Examiner* — Jason Lappas
(74) *Attorney, Agent, or Firm* — Vierra Magen Marcus LLP

(57) ABSTRACT

A system and methods to find the threshold voltage distribution across a set of nonvolatile memory cells, such that embodiments may incorporate this distribution information into calculations that may change the read compare voltages used to read the memory cells, while ensuring adequate separation in read voltage between different data states at which the memory cells may be read.

18 Claims, 19 Drawing Sheets

(56) References Cited

U.S. PATENT DOCUMENTS

| | | | |
|---|---|---|---|
| 6,226,200 | B1 | 5/2001 | Eguchi |
| 6,456,528 | B1 | 9/2002 | Chen |
| 6,522,580 | B2 | 2/2003 | Chen |
| 6,763,424 | B2 | 7/2004 | Conley |
| 6,859,397 | B2 | 2/2005 | Lutze |
| 7,023,736 | B2 | 4/2006 | Cernea |
| 7,046,568 | B2 | 5/2006 | Cernea |
| 7,162,376 | B2 | 1/2007 | Oh |
| 7,181,565 | B2 | 2/2007 | Surico |
| 7,187,585 | B2 | 3/2007 | Li |
| 7,196,931 | B2 | 3/2007 | Cernea |
| 7,254,668 | B1 | 8/2007 | Chang |
| 7,315,917 | B2 | 1/2008 | Bennett |
| 7,502,254 | B2 | 3/2009 | Murin |
| 7,613,045 | B2 | 11/2009 | Murin |
| 7,619,930 | B2 * | 11/2009 | Mokhlesi ............... G11C 5/147 365/185.21 |
| 7,848,152 | B1 | 12/2010 | Huang |
| 7,957,187 | B2 | 6/2011 | Mokhlesi |
| 8,073,648 | B2 | 12/2011 | Shlick |
| 8,077,520 | B1 | 12/2011 | Yang |
| 9,076,545 | B2 | 7/2015 | Mokhlesi |
| 2004/0136236 | A1 | 7/2004 | Cohen |
| 2004/0255090 | A1 | 12/2004 | Guterman |
| 2005/0024939 | A1 | 2/2005 | Chen |
| 2005/0105333 | A1 | 5/2005 | Park |
| 2005/0248988 | A1 * | 11/2005 | Guterman .......... G11C 16/0483 365/185.28 |
| 2006/0039212 | A1 | 2/2006 | Chiang |
| 2006/0126383 | A1 | 6/2006 | Shappir |
| 2006/0140007 | A1 | 6/2006 | Cernea |
| 2006/0158947 | A1 | 7/2006 | Chan |
| 2006/0221692 | A1 | 10/2006 | Chen |
| 2007/0089034 | A1 | 4/2007 | Litsyn |
| 2007/0147113 | A1 | 6/2007 | Mokhlesi |
| 2008/0175055 | A1 | 7/2008 | Kim |
| 2008/0259684 | A1 | 10/2008 | Shlick |
| 2008/0263266 | A1 | 10/2008 | Sharon |
| 2008/0285351 | A1 | 11/2008 | Shlick |
| 2009/0003058 | A1 | 1/2009 | Kang |
| 2010/0296350 | A1 | 11/2010 | Kim |
| 2011/0258496 | A1 | 10/2011 | Tseng |
| 2011/0289388 | A1 | 11/2011 | Nelson |
| 2012/0163085 | A1 | 6/2012 | Alrod |

OTHER PUBLICATIONS

Himeno et al., "A new technique for measuring threshold voltage distribution in flash EEPROM devices," Proc. of the 1995 Int. Conf. on Microelectronic Test Structures, 1995, pp. 283-287.

Ko, et al., "March Test and On-Chip Test Circuit of Flash Memories," Proc. 43rd IEEE Midwest Symp. on Circuits and Systems, 2000.

Portal et al., "EEPROM Memory: Threshold Voltage Built in Self Diagnosis," ITC International Test Conference, 2003 IEEE, Paper 2.1, pp. 23-28.

Toshiba, Tentative Toshiba MOS Digital Integrated Circuit Silicon Gate CMOS, TH58NVG1S3AFT05, 2003.

European Search Report dated Jun. 8, 2009, European Patent Application No. 08251689.9.

Amendment dated Dec. 18, 2009 in European Patent Application No. 08251689.9 filed May 8, 2008.

Office Action dated May 5, 2009, U.S. Appl. No. 11/945,120, filed Nov. 26, 2007.

Notice of Allowance dated Aug. 21, 2009, U.S. Appl. No. 11/945,120, filed Nov. 26, 2007.

Office Action dated Oct. 20, 2010, Chinese Patent Application No. 200810094742.X filed May 8, 2008.

Office Action dated Sep. 19, 2014, U.S. Appl. No. 13/743,563.

Response to Office Action dated Nov. 10, 2014, U.S. Appl. No. 13/743,563.

Notice of allowance dated Dec. 16, 2014, U.S. Appl. No. 13/743,563.

Notice of allowance dated Mar. 12, 2015, U.S. Appl. No. 13/743,563.

PCT International Search Report dated Jun. 6, 2014, PCT Patent Application No. PCT/US2014/011889.

New Application filed May 29, 2015, U.S. Appl. No. 14/726,207.

International Preliminary Report on Patentability dated Jul. 30, 2015 in International Patent Application No. PCT/US2014/011889, 7 pages.

Restriction Requirement mailed Jul. 21, 2016, in U.S. Appl. No. 14/726,207, filed May 29, 2015.

* cited by examiner

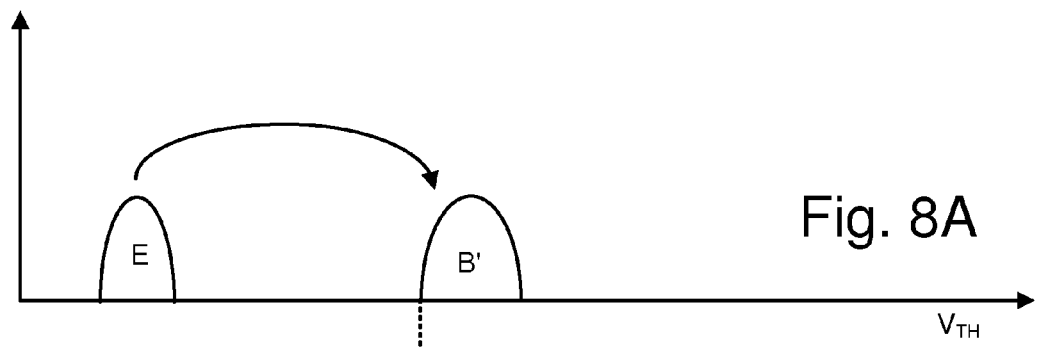
Fig. 8A
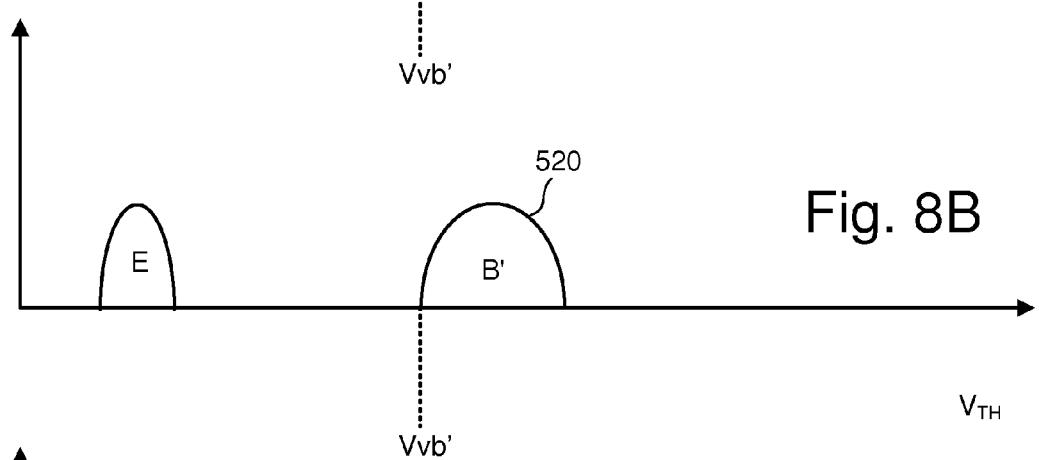
Fig. 8B
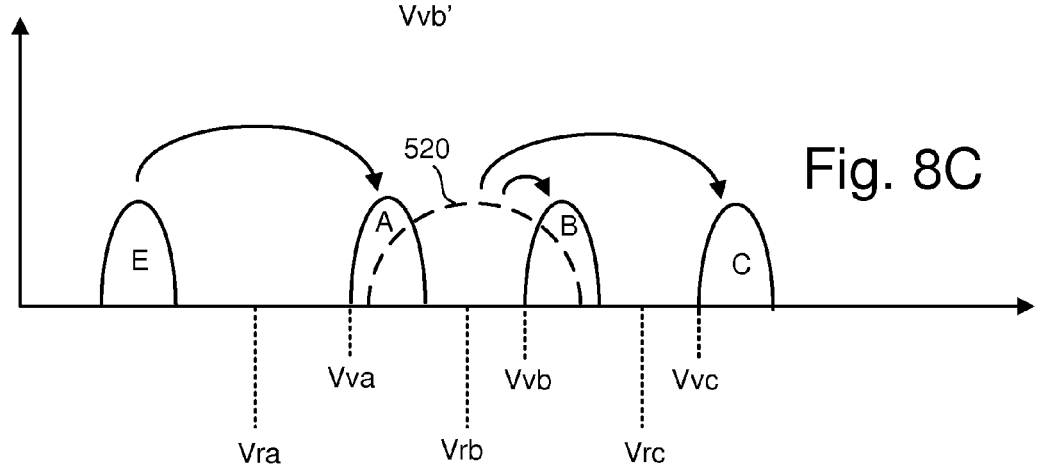
Fig. 8C
Fig. 9
|  | State E | State A | State B | State C |
|---|---|---|---|---|
| Upper Page | 1 | 0 | 0 | 1 |
| Lower Page | 1 | 1 | 0 | 0 |

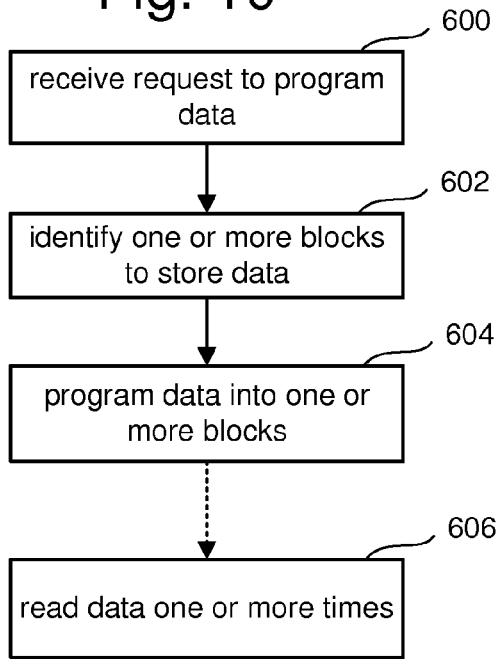
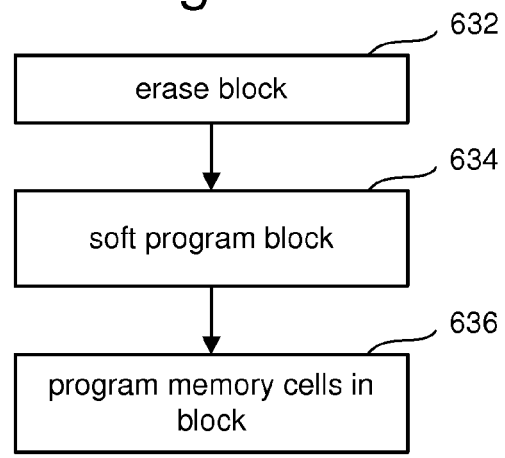

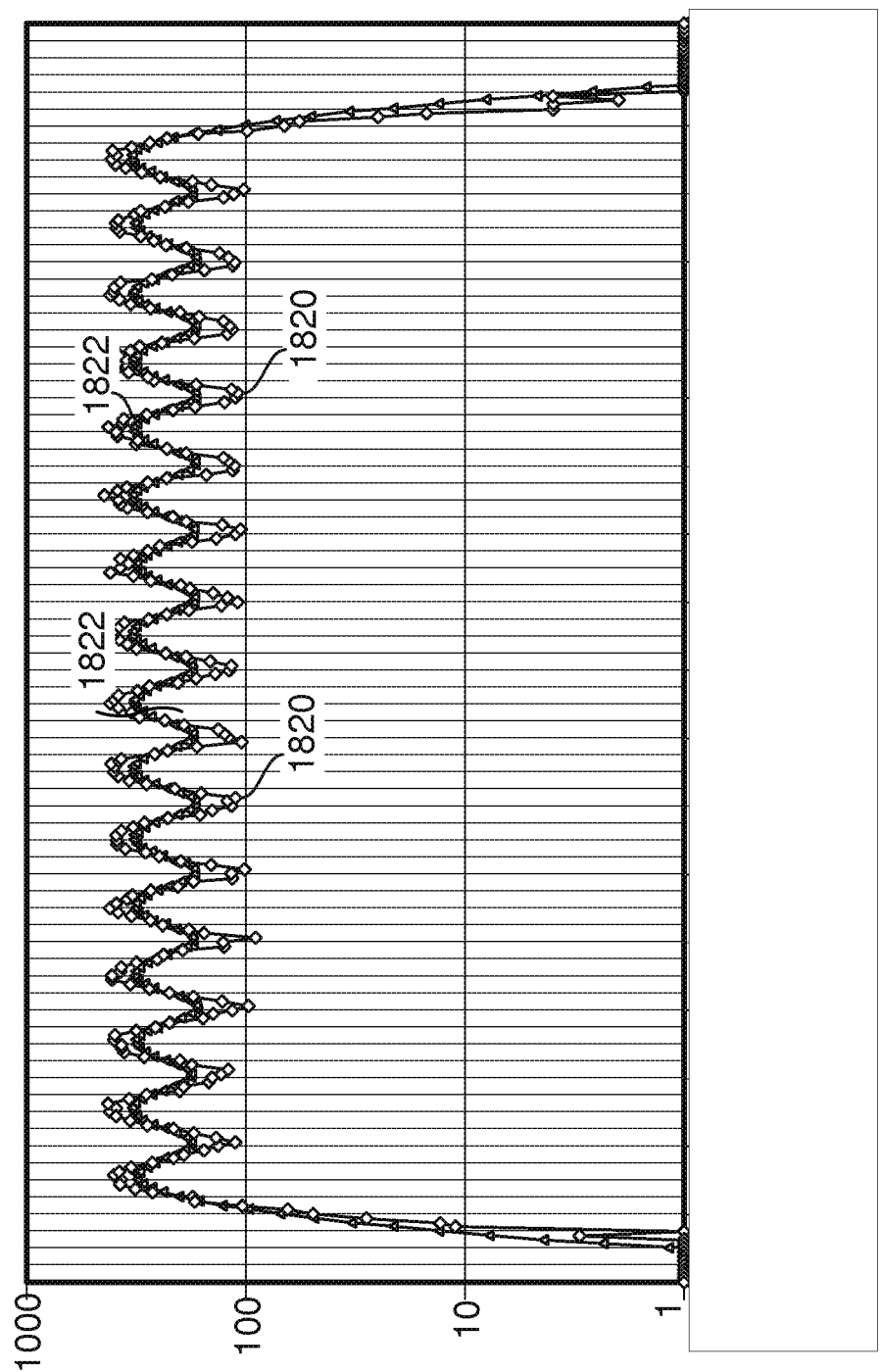

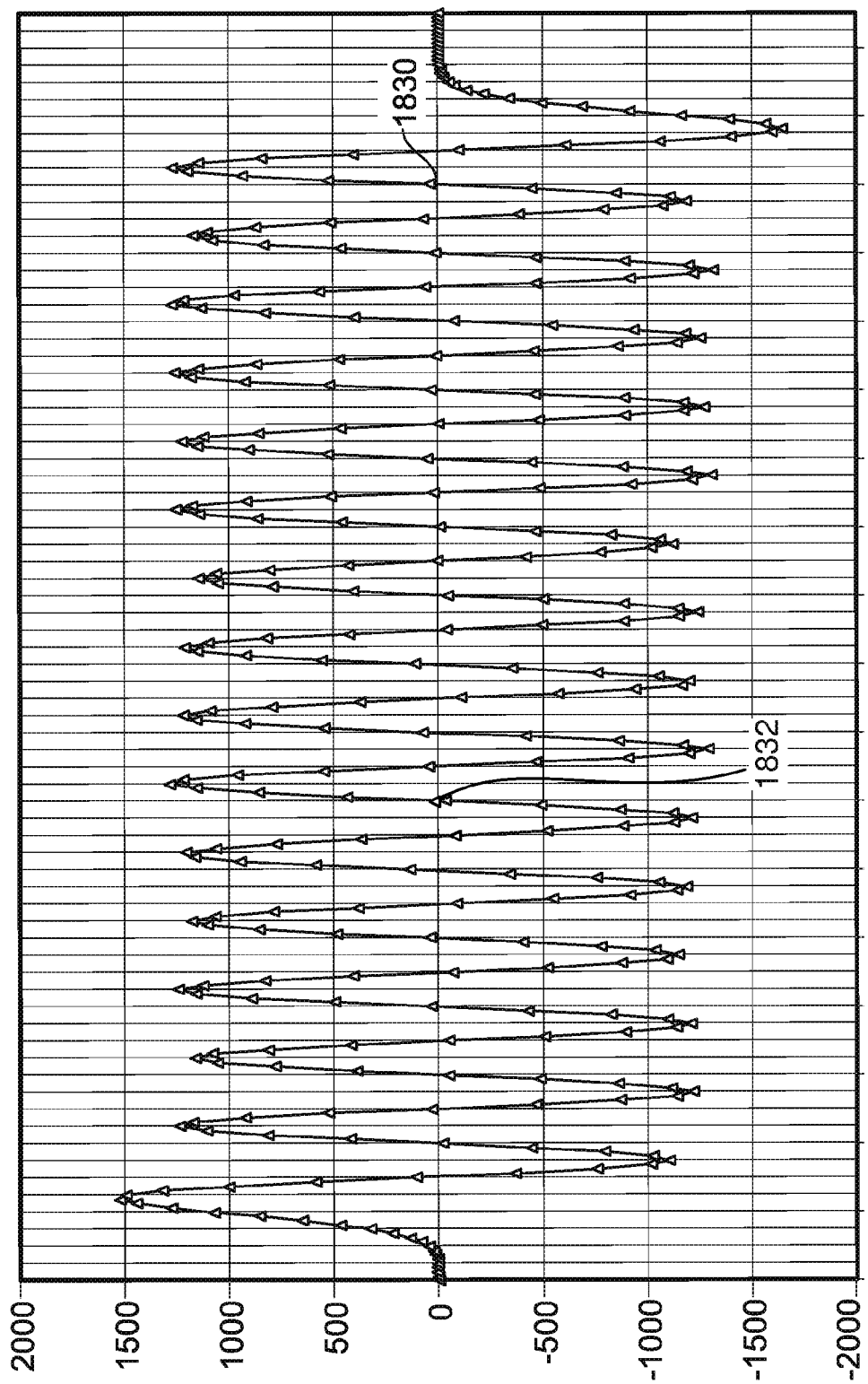

DYNAMIC ADJUSTMENT OF READ VOLTAGE LEVELS BASED ON MEMORY CELL THRESHOLD VOLTAGE DISTRIBUTION

This application is a divisional application of U.S. patent application Ser. No. 13/743,563, "DYNAMIC ADJUSTMENT OF READ VOLTAGE LEVELS BASED ON MEMORY CELL THRESHOLD VOLTAGE DISTRIBUTION," filed on Jan. 17, 2013, by Mokhlesi, incorporated herein by reference in its entirety.

BACKGROUND OF THE INVENTION

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Some EEPROM and flash memory devices have a floating gate that is used to store two ranges of charges and, therefore, the memory cell can be programmed/erased between two states (an erased state and a programmed state). Such a flash memory device is sometimes referred to as a binary memory device.

A multi-state memory device stores multiple bits of data per memory cell by identifying more than two distinct valid threshold voltage distributions (or data states) separated by forbidden ranges. Each distinct threshold voltage distribution corresponds to a predetermined value for the set of data bits encoded in the memory device. For example, a memory cell that stores two bits of data uses four valid threshold voltage distributions. A memory cell that stores three bits of data uses eight valid threshold voltage distributions.

Although non-volatile memory has proven to be very reliable, sometimes errors can occur. Many memory systems uses Error Correction Codes (ECC) to correct errors found during a read process. Sometimes, however, ECC cannot correct all errors.

Sometimes, because of thermal effects from the environment or capacitive coupling from neighboring memory cells, electrons may be added to or removed from the floating gate of a memory cell. As a consequence, the distribution of the threshold voltages of a large set of memory cells may change, which can result in errors when reading the data.

DESCRIPTION OF THE DRAWINGS

FIGS. 8A-8C depict examples of threshold voltage distributions and an example programming process.

FIG. 9 is a table showing one example of a relationship between threshold voltage distributions and data stored in memory cells.

FIG. 10 is a flow chart describing one embodiment of a process for operating non-volatile storage.

FIG. 11 is a flow chart describing one embodiment of a process for programming non-volatile storage.

FIG. 18A is a graph of threshold voltage distribution data.

FIG. 18B is a graph showing the result of a derivative calculation.

DETAILED DESCRIPTION

The following description applies to a system and methods to measure the threshold voltage distribution of a set of nonvolatile memory cells. The system can then adjust the read compare voltages used to read the memory cells in order to account for drift in the threshold voltage distribution. Embodiments will now be described with reference to the drawings enclosed with this document.

Figure 1:
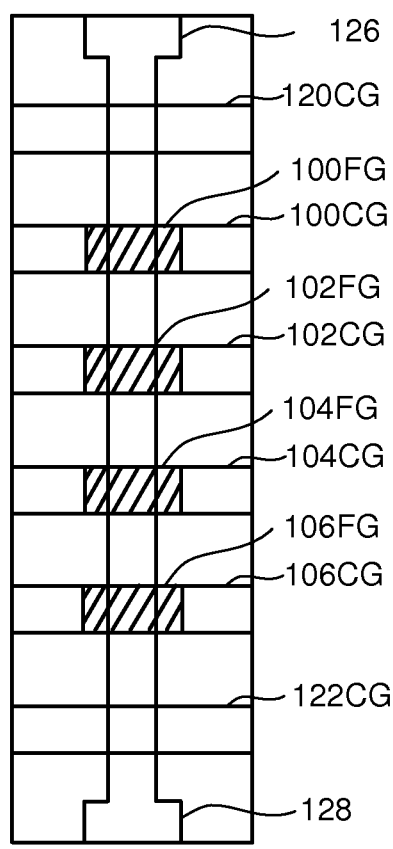
FIG. 1 is a top view of a NAND string.
Figure 2:
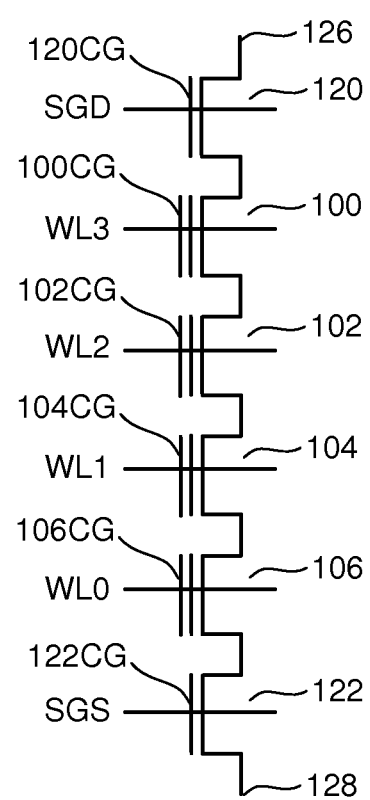
FIG. 2 is an equivalent circuit diagram of the NAND string.

One example of a non-volatile storage system that can be used to implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

Figure 3:
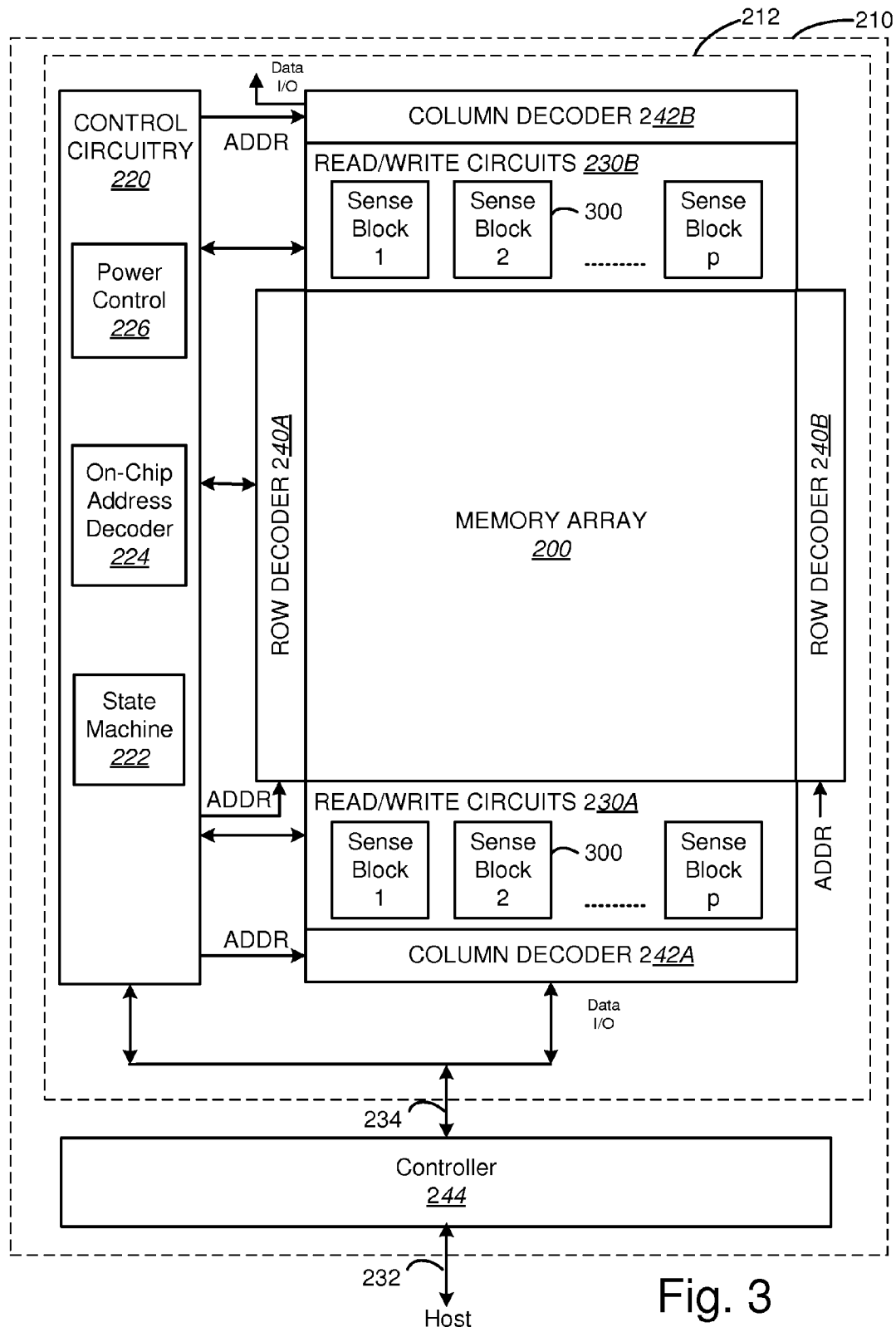
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die (or integrated circuit) 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224, and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O. Temperature sensor 228 can be an analog or digital temperature sensor known in the art.

In one embodiment, controller 244 is implemented on a different die (or integrated circuit) than memory chip 212. In some embodiments, the controller 244 interfaces with the Host and with control circuitry 220 as well as the decoders. In some embodiments, controller 244 interfaces with the read/write circuits.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
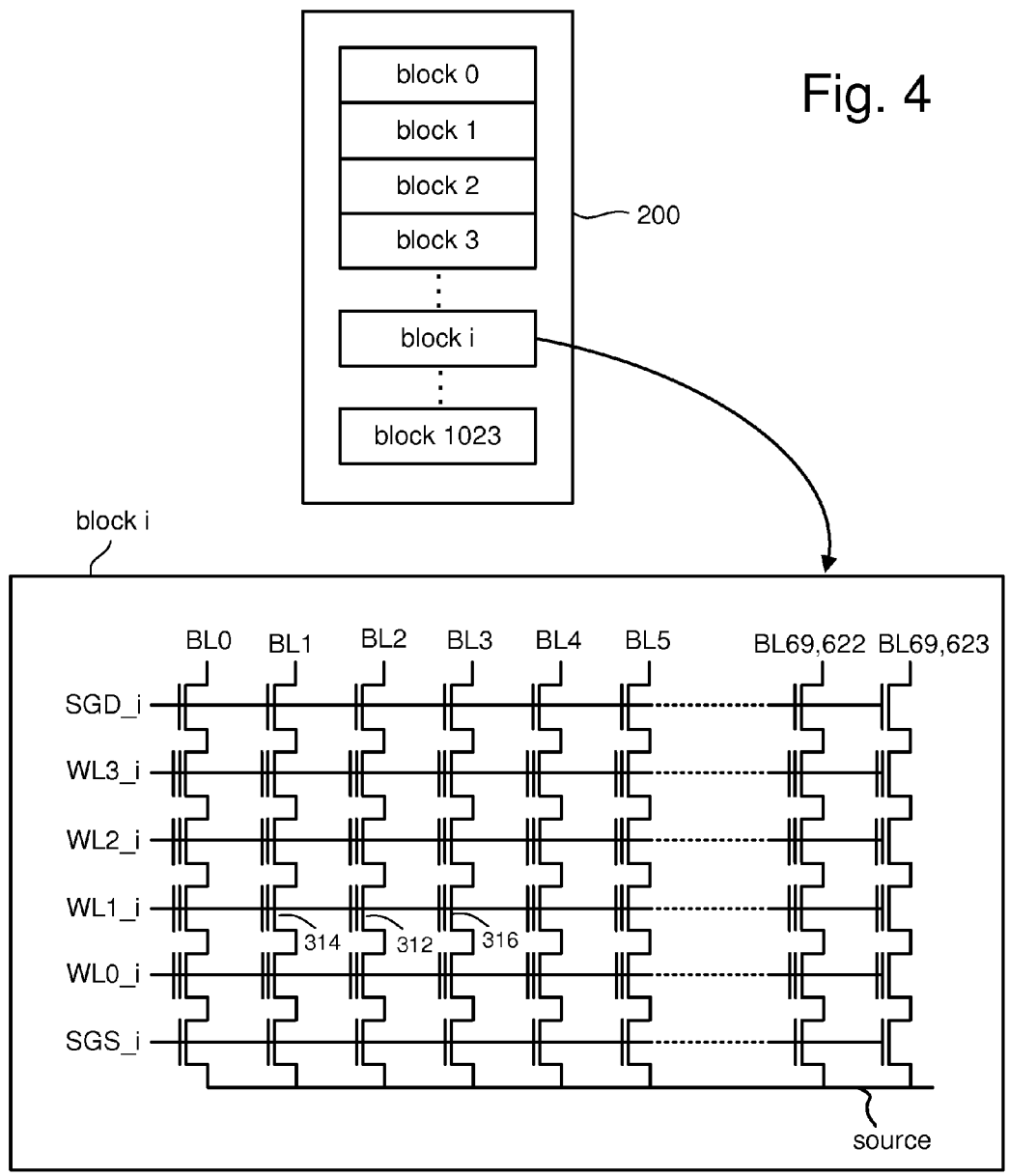
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount of blocks) of memory cells. As is common for flash memory systems, the block is the unit of erase. That is, each block contains the minimum number of memory cells that are erased together. Other units of erase can also be used.

A block contains a set of NAND strings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used. Additionally, a block can have more or less than 69,624 bit lines.

Figure 5:
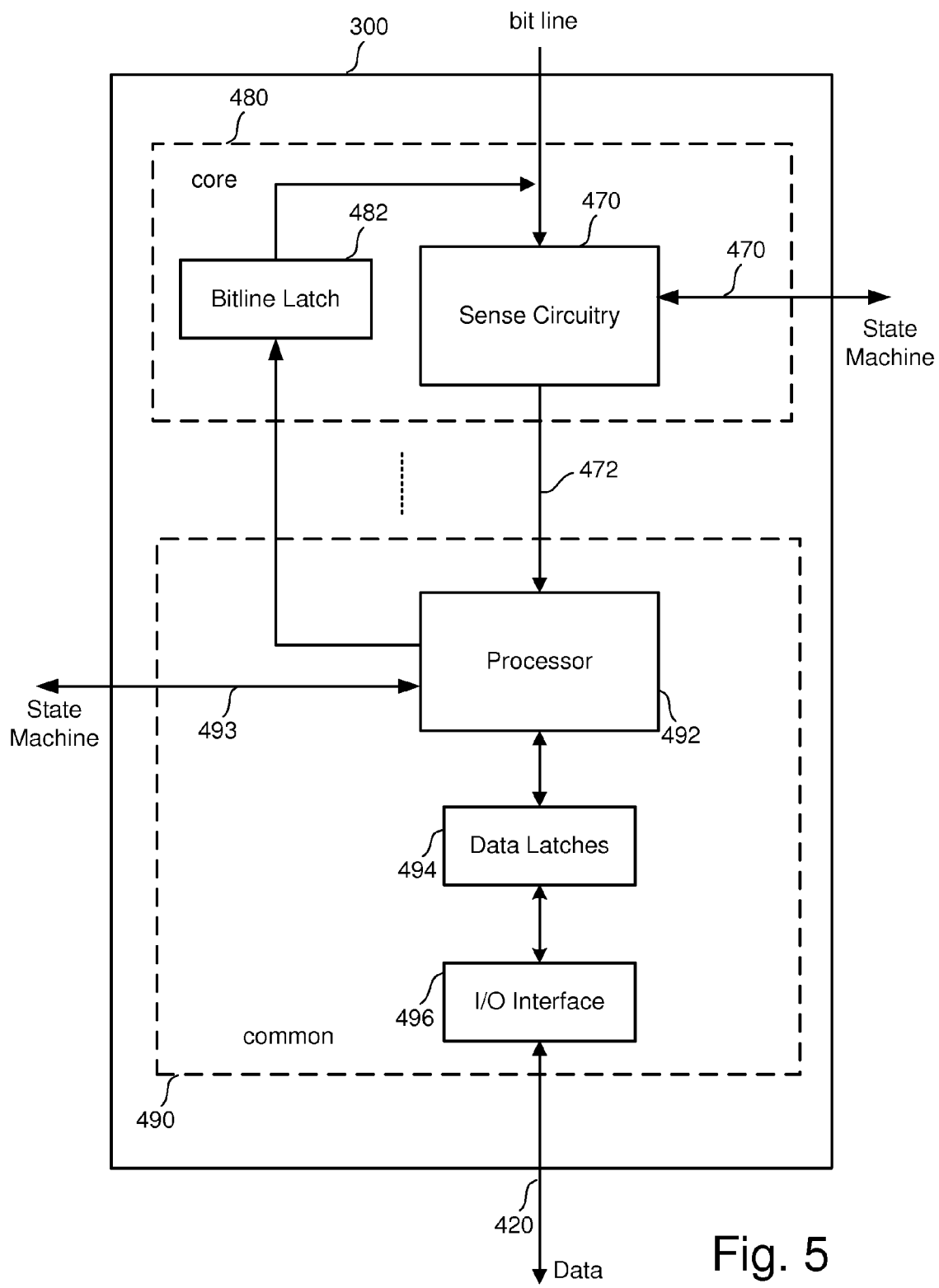
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd) in order to lock out memory cells from programming.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420.

During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
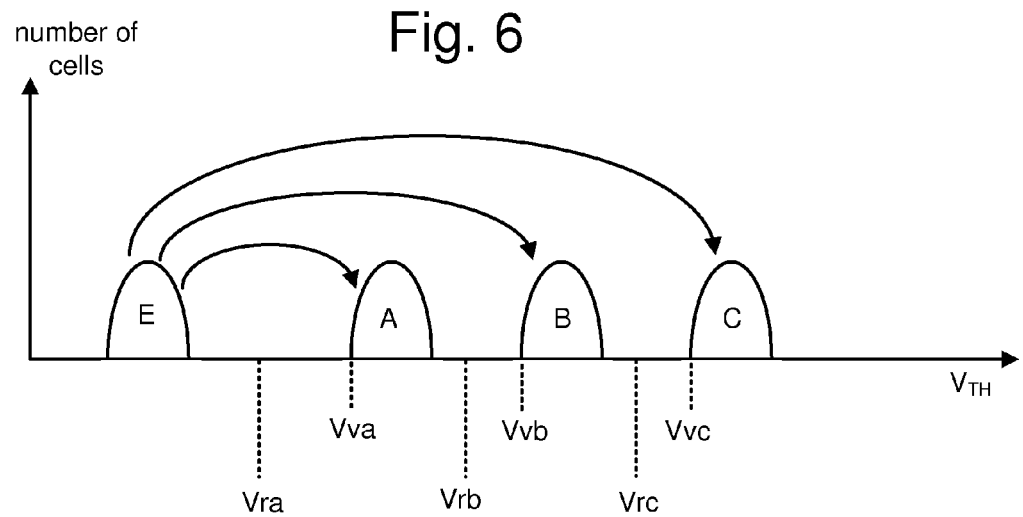
FIG. 6 depicts an example set of threshold voltage distributions and depicts an example programming process.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (corresponding to data states) for the memory cell array when each memory cell stores two bits of data. Other embodiments, however, may use more or less than two bits of data per memory cell (e.g., such as three, or four or more bits of data per memory cell). The technology described herein is not limited to any specific number of bits per memory cell.

FIG. 6 shows a first threshold voltage distribution E for erased memory cells. Three threshold voltage distributions A, B and C for programmed memory cells are also depicted. In one embodiment, the threshold voltages in the E distribution are negative and the threshold voltages in the A, B and C distributions are positive. Each distinct threshold voltage distribution of FIG. 6 corresponds to predetermined values for the set of data bits. The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 also shows three read reference voltages, Vra, Vrb and Vrc (also called read compare levels/values), for reading data from memory cells. By testing whether the threshold voltage of a given memory cell is above or below Vra, Vrb and Vrc, the system can determine what state the memory cell is in. For example, if a memory cell has a threshold voltage less than Vra, it is assumed to be in state E. If a memory cell has a threshold voltage less than Vrb and greater than Vra, it is assumed to be in state A. If a memory cell has a threshold voltage less than Vrc and greater than Vrb, it is assumed to be in state B. If a memory cell has a threshold voltage greater than Vrc, it is assumed to be in state C.

FIG. 6 also shows three verify reference voltages, Vva, Vvb and Vvc (also called verify compare values/levels). When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. Then, a programming process is used to program memory cells directly into states A, B or C. While some memory cells are being programmed from state E to state A, other memory cells are being programmed from state E to state B and/or from state E to state C.

Figure 7:
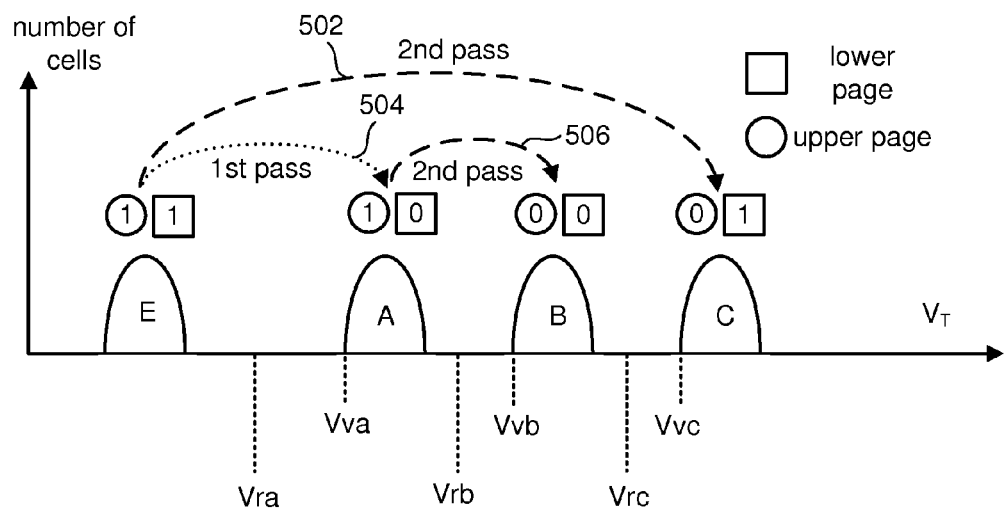
FIG. 7 depicts an example set of threshold voltage distributions and depicts an example programming process.

FIG. 7 illustrates one example of a two-stage technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 504. That concludes the first programming stage.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 502. If the memory cell had been programmed into state A as a result of the first programming stage, then the memory cell is further programmed in the second stage so that the threshold voltage is increased to be within state B, as depicted by arrow 506. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application 2006/0126390, incorporated herein by reference in its entirety.

FIGS. 8A-C describe another multi-stage programming process for programming non-volatile memory. The process of FIG. 8A-C reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. FIG. 9 shows one example of the relationship between states and data stored. State E stores data 11. State A stores data 01. State B stores data 00. State C stores data 10 This is an example of Gray coding. Other encodings of data to physical data states can also be used. Each memory cell stores two pages of data. For reference purposes, these pages of data will be called upper page and lower page; however, they can be given other labels. With reference to state A for the process of FIGS. 8A-C, the upper page stores data 0 and the lower page stores data 1. With reference to state B, both pages stores data 0. With reference to state C, the lower pages stores data 0 and the upper page stores data 1. In other embodiments, the programming processes of FIGS. 6 and 7 and be configured to program data according to the table of FIG. 9.

The programming process of FIGS. 8A-C is a two-stage programming process; however, the process of FIGS. 8A-C can be used to implement a three stage process, a four stage process, etc. In the first stage, the lower page is programmed. If the lower page is to remain data 1, then the memory cell state remains at state E. If the lower page data is to be programmed to 0, then the threshold of voltage of the memory cell is raised such that the memory cell is programmed to state B'. FIG. 8A shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (on word line WLn+1) in the NAND string will then be programmed with respect to its lower page. After programming the neighbor memory cell, the floating gate to floating gate coupling effect may raise the apparent threshold voltage of earlier programmed memory cell. This will have the effect of widening the threshold voltage distribution for state B' to that depicted as threshold voltage distribution 520 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 520 and the upper page data is to remain at 1, then the memory cell will be programmed to final state C. If the memory cell is in intermediate threshold voltage distribution 520 and the upper page data is to become data 0, then the memory cell will be to state B. The process depicted by FIGS. 8A-C reduces the effect of floating gate to floating gate coupling because only the upper page programming of neighbor memory cells will have an effect on the apparent threshold voltage of a given memory cell.

Although FIGS. 8A-C provide an example with respect to four data states and two pages of data, the concepts taught by FIGS. 8A-C can be applied to other implementations with more or less than four states and different than two pages. More details about the programming process of FIG. 8A-C can be found in U.S. Pat. No. 7,196,928, incorporated herein by reference.

FIG. 10 is a flow chart describing one embodiment of a process for operating non-volatile memory, such as the system of FIG. 3 (or other systems). In step 600, a request to program data is received. The request can be from a host, another device or the controller. The request can be received at the controller, control circuitry, state machine, or other device. In response to the request, the controller, control circuitry, state machine, or other component will determine which block of flash memory cells will be used to store the data in step 602. The data will be programmed into the determined block using any of the programming processes described above (or other programming processes) in step 604. The programmed data will be read one or many times in step 606. There is a dashed line between steps 604 and 606 because an unpredictable amount of time may pass between the steps, and step 606 is not performed in response to step 604. Rather, step 606 is performed in response to a request to read the data or other event.

FIG. 11 is a flow chart describing a programming process for programming memory cells in a block. The process of FIG. 11 is one embodiment of step 604 of FIG. 10. In step 632, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells is lowered. Erasing can be performed on the entire memory array, on individual blocks, or another unit of cells. Other techniques for erasing can also be used.

In step 634, soft programming is performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 636, the memory cells of the block are programmed as described herein. The process of FIG. 11 can be performed at the direction of the state machine, controller or combination of state machine and controller, using the various circuits described above. For example, the controller may issue commands and data to the state machine to program the data. In response, the state machine may operate the circuits described above to carry out the programming operations.

Figure 12:
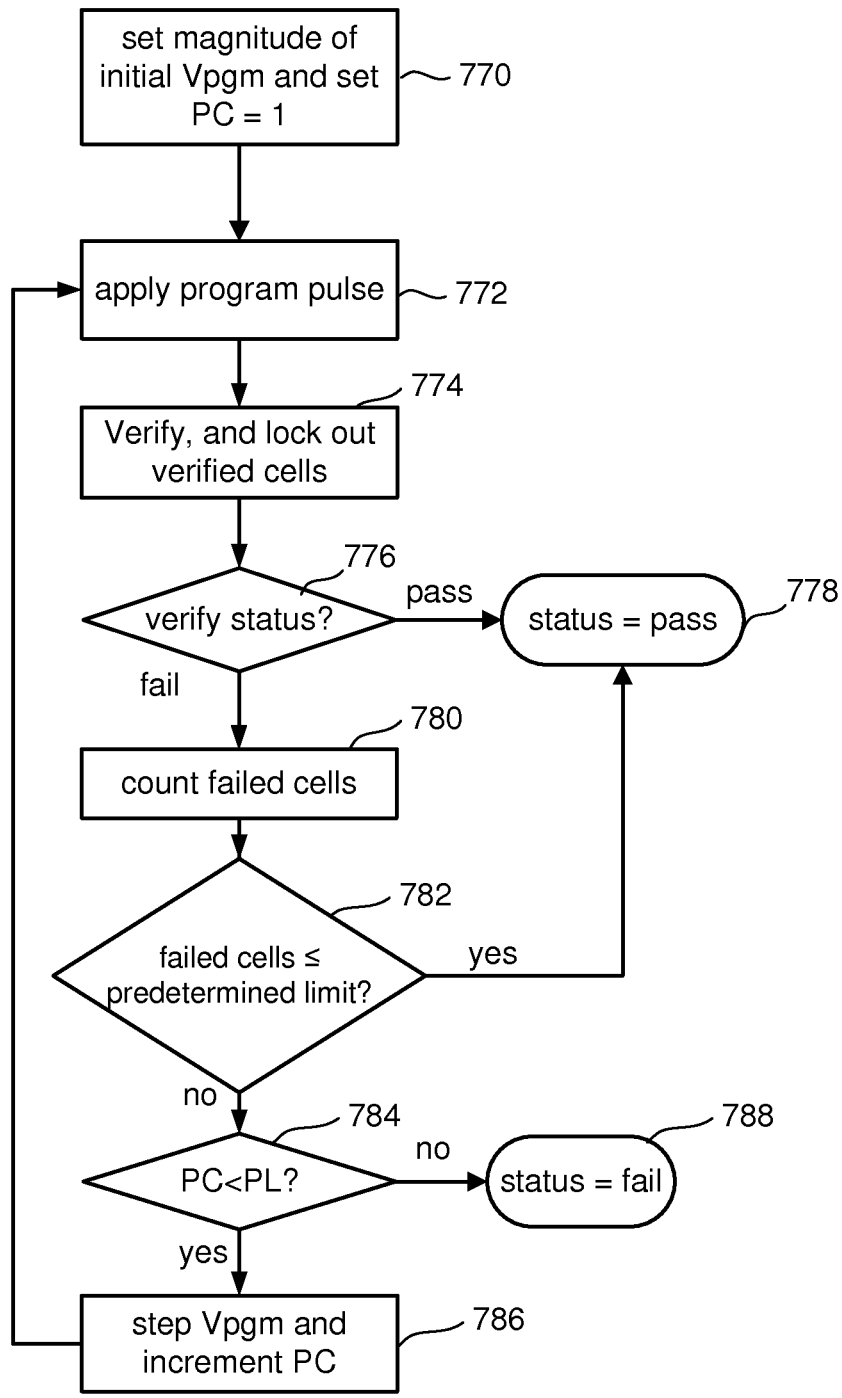
FIG. 12 is a flow chart describing one embodiment of a process for performing programming operations for non-volatile storage.

FIG. 12 is a flow chart describing one embodiment of a process for performing programming on one or more memory cells connected to a common word line. Therefore, when programming a block of memory cells the process of FIG. 12 is performed one or more times for each word line of the block. The process of FIG. 12 can be performed one or multiple times during step 636 of FIG. 11. For example, the process of FIG. 12 can be used to program memory cells (e.g., full sequence programming) from state E directly to any of states A, B or C. Alternatively, the process of FIG. 12 can be used to perform one or each of the stages of the process of FIG. 7, FIGS. 8A-C, or other programming schemes. For example, when performing the process of FIGS. 8A-C, the process of FIG. 12 is used to implement the first stage that includes programming some of the memory cells from state E to state B'. The process of FIG. 12 can then be used again to implement the second stage that includes programming some of the memory cells from state E to state A and from state B' to states B and C.

Typically, the program voltage applied to the control gate during a program operation is applied as a series of program pulses. Between programming pulses are a set of one or more verify pulses to perform verification. In many implementations, the magnitude of the program pulses is increased with each successive pulse by a predetermined step size. In step 770 of FIG. 12, the programming voltage (Vpgm) is initialized to the starting magnitude (e.g., ~12-16V or another suitable level) and a program counter PC maintained by state machine 222 is initialized at 1.

In step 772, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art in order to avoid program disturb. There are many different boosting schemes that can be used with the technology described herein. To provide the boosting voltages on the unselected word lines, step 772 includes stepping the voltages of the neighboring unselected word lines. That is, the unselected word lines that are next to the selected word line will first be raised to one or more intermediate voltages and then subsequently raised to their one or more target boosting voltages. The program voltage will also be raised first to an intermediate voltage and then to the target program voltage concurrently with the neighboring unselected word lines.

In one embodiment, if a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line that should be programmed are programmed concurrently. That is, they are programmed at the same time (or during overlapping times). In this manner all of the memory cells connected to the selected word line will concurrently have their threshold voltage change, unless they have been locked out from programming. In step 774, the appropriate memory cells are verified using the appropriate set of target levels to perform one or more verify operations. If a memory cell is verified to have reached its target, it is locked out from further programming. One embodiment for locking out a memory cell from further programming is to raise the corresponding bit line voltage to, for example, Vdd.

In step 776, it is determined whether all the memory cells have reached their target threshold voltages. If so, the programming process is complete and successful because all selected memory cells were programmed and verified to their target states. A status of "PASS" is reported in step 778. If, in 776, it is determined that not all of the memory cells have reached their target threshold voltages, then the programming process continues to step 780.

In step 780, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks 300 (see FIG. 3) will store the status (pass/fail) of their respective memory cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed. In one embodiment, there is one total counted, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 784 and the program counter PC is checked against the program limit value (PL). One example of a program limit value is 20; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

During verify operations (e.g., step 774) and read operations, the selected word line is connected to a voltage, a level of which is specified for each read operation (e.g., Vra, Vrb, and Vrc,) or verify operation (e.g. Vva, Vvb, and Vvc) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

Sometimes, because of thermal effects from the environment, capacitive coupling from neighboring memory cells, or other effects, the threshold voltage of the cell as measured from the control gate may change. This can result in errors when reading the data. Such read errors may be prevented by changing the read compare points (e.g., Vra, Vrb and Vrc) in response to changes in the distribution of the threshold voltages for the relevant population of memory cells.

Figure 13:
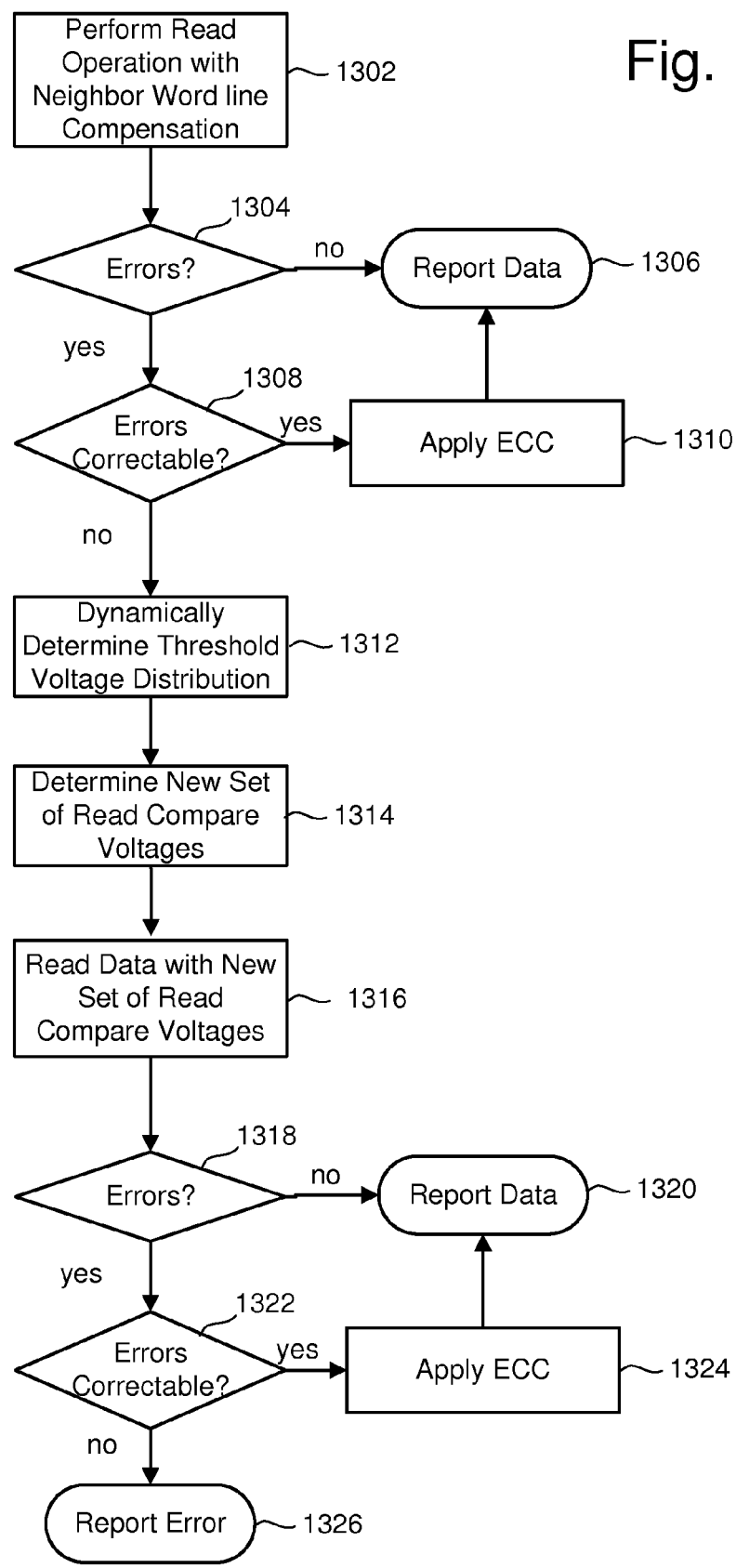
FIG. 13 is a flow chart describing a one embodiment of a process for reading non-volatile storage.

FIG. 13 is a flow chart showing one embodiment of a method to read data, and, if necessary, update the read compare voltages used to perform read operations. The process begins with step 1302, in which the system performs a read operation on a subset of the data stored in memory cells connected to a selected word line. This may be done by applying a read compare voltage on the word line and testing the current flowing through the bit line to determine whether the memory cell transistors are conducting. In some embodiments of step 1302, the system may also employ "Neighbor Word line Compensation", wherein the system changes the voltage on one or more neighboring (or nearby) word lines in order to account for capacitive coupling between neighboring (or nearby) memory cells. More information about Neighbor Word line Compensation can be found in U.S. Pat. No. 7,499,319, titled "Read Operation for Non-Volatile Storage with Compensation for Coupling", incorporated herein by reference in its entirety. One embodiment of step 1302 includes applying a current read compare voltage to a selected memory cell, applying a particular voltage to a neighbor of the selected memory cell based on a current condition of the neighbor while applying the current read compare voltage to the selected memory cell and sensing a condition of the selected memory cell (i.e. non-volatile storage element).

In step 1304, the system checks whether or not there are errors with the data read from the selected word line. If there is no error detected, then the data is assumed to be correct, and in step 1306, the system reports the read data to the user.

If, in step 1304, the system does detect errors, then in step 1308, the system checks whether the errors can be corrected using methods such as ECC. If the errors can be corrected, then the system corrects the errors in step 1310 before reporting the corrected data in step 1306.

If, however, the system determines that standard methods such as ECC cannot resolve the detected errors, then the system will attempt to recover the data by update the read compare voltages and re-performing the read operations with the updated read compare voltages. In step 1312, then determines the current threshold distribution of the relevant population of memory cells. One embodiment of step 1312 includes: for each set of read compare voltages of a plurality of different sets of read compare voltages, performing multiple sensing operations that each sense a different page of data from a population of non-volatile storage elements and determining threshold voltage distributions for the population of non-volatile storage elements based on the multiple sensing operations. More information about determining the current threshold distribution is described below. In step 1314, the system uses the newly determined current threshold voltage distributions learned in step 1312 to update the read compare voltages. In some cases, the read compare voltages determined in this step may differ from the previous or default read compare voltages used for read operations such as that employed in step 1302. In some embodiments, if the system has not changed any of the read compare voltages in step 1314, then the system may proceed directly to step 1326 and report an error.

In step 1316, the memory system performs a read operation that is similar to the process conducted in step 1302, except that the read operation of step 1316 uses the new read compare voltages determined in step 1314. In step 1318, the memory system checks to determine whether there are errors in the data read in step 1316. If an error is not found, then in step 1320 the system reports the read data to the user. If errors are detected, then the system checks in step 1322 (as in step 1308) whether the errors are correctable. If so, then the system corrects the errors in step 1324 (e.g., using ECC) and reports the corrected data in step 1320. Otherwise, the system reports an error in step 1326.

Figure 14:
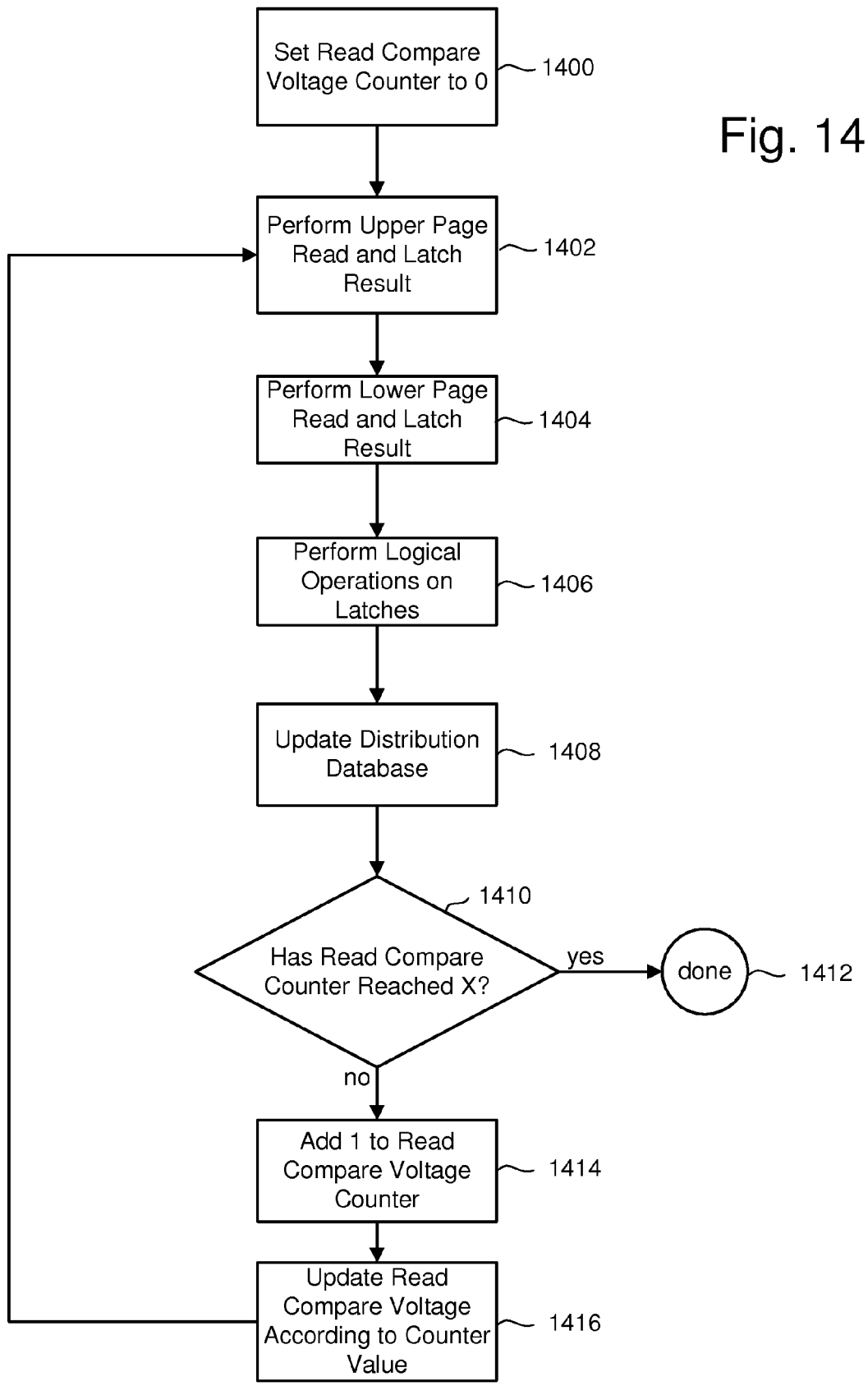
FIG. 14 is a flow chart showing a process by which the system obtains the distribution of memory cells given a fixed read compare voltage.

FIG. 14 is a flow chart showing a process that includes, for each set of read compare voltages of a plurality of different sets of read compare voltages, performing multiple sensing operations that each sense a different page of data from a population of non-volatile storage elements. The results of this process is used with a set of equations provided below to determine threshold voltage distributions for the population of non-volatile storage elements based on the multiple sensing operations. This represents one example implementation of step 1312 of FIG. 13. In some embodiments, the process of FIG. 14 is performed on all (or a subset of) memory cells connected to a word line. In other embodiments, the process of FIG. 14 is performed on all (or a subset of) memory cells in a block (or other unit). As will be explained later, the determined threshold voltage distribution may then be used to determine new optimal read compare voltages for the available states. In step 1400, the system initializes a counting mechanism. In some embodiments, a digital counter on the memory chip may be set to '0'. In other embodiments, the counting process may be handled by external controller 244. The value of this counter corresponds to the read compare voltages used in steps 1402 and 1404, as explained below. By way of example only, suppose that the voltages between 0 and 5.4 Volts are designated by the system to be the range of threshold voltages for the population of memory cells. Then, in one embodiment, when the counter is 0, Vra is set to 0V, Vrb is set to 1.8V, and Vrc is set to 3.6V. In step 1402, the system reads the upper pages on a set of memory cells, using a process such as that described in FIG. 15. Then, in step 1404, the system reads the lower pages on the same set of memory cells as those read in step 1402, using a process such as that described in FIG. 16. In steps 1402 and 1404, data bits representing the results of the read operations are stored in a pair of latches, though in some embodiments in which memory cells store more bits, more latches can be used. In step 1406, the system performs logical operations on the bits stored in these latches in order to determine the state of the cell which was read in steps 1402 and 1404. More information about step 1406 is provided below. The memory system will maintain a data structure of the results of the various iterations of step 1406. The data structure is referred to as the Distribution Database. In step 1408, the results of the current step 1406 are added to the results of previous iterations of step 1406 (if any) in the Distribution Database. In one embodiment, the data is moved to and stored in the controller, while in other embodiments the data is stored in the memory chip.

In step 1410, the system checks whether the counter (or equivalent) that was initialized in step 1400 has reached a certain maximum value, which will be denoted herein as 'X.' In one embodiment, which will be explained in greater detail below, X may equal 9, such that the system may complete the process of FIG. 14 up to 9 times. If the check of step 1410 passes, then in step 1412, the system finishes and exits the process. However, if the check of step 1410 does not pass, then the system transitions to step 1414, wherein the system adds 1 to the counter checked by step 1410. After step 1414, the system transitions to step 1416, wherein the system changes the read compare voltages used in the read operations of steps 1402 and 1404. In some embodiments, the read compare voltages may each be increased by 0.2V every time the system performs step 1416. Thus, when the counter value is at 1, Vra may be set to 0.2V, Vrb may be set to 2.0V, and Vrc may be set to 3.8V. Similarly, when the counter value is at 8, Vra may be set to 1.6V, Vrb may be set to 3.4V, and Vrc may be set to 5.2V. After step 1416, the system moves back to step 1402, wherein the system will repeat steps 1402-1410, wherein the read operations will be performed using the read compare voltages updated by step 1416.

Figure 15:
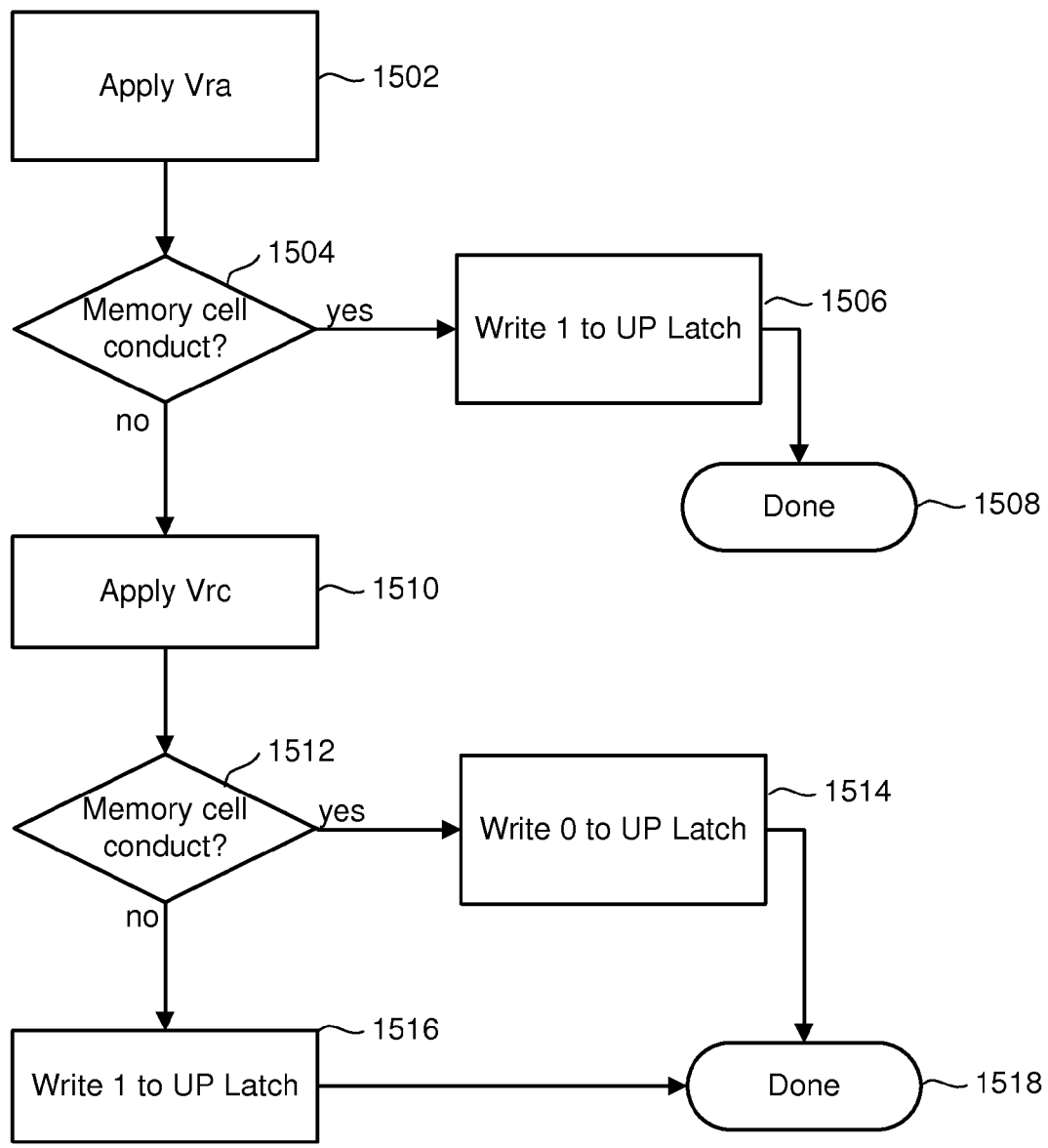
FIG. 15 is a flow chart describing one embodiment of a process for reading the upper page on a memory cell.

FIG. 15 is a flow chart describing a process for reading the upper page of a memory cell. The process of FIG. 15 is one example implementation of step 1402 of FIG. 14. While the following description applies to memory cells that store two bits of data per memory cell, the process can be adjusted to read memory cells that can store any number of bits. The process begins with step 1502, in which the system performs a read operation at Vra. That is, the voltage level Vra is applied to the selected word line. In step 1504, the system determines whether the memory cells turn on in response to Vra at the control gates by testing whether the memory cells conduct current. Those memory cells that conduct current in response to Vra have a threshold voltage less than or equal to Vra. If the memory cell conducts, then in step 1506 the system stores a "1" bit on the latch associated with the Upper Page (UP Latch). If the memory cell conducts when the control gate of the memory cell is at Vra, then the memory cell is in state E, corresponding to two-bit binary code "11", as shown in FIG. 9. The Upper Page latch into which the page value is stored may be located with the other data latches in block 494 of FIG. 5. After step 1506, the system finishes the process in step 1508. Otherwise, the system proceeds to step 1510 to perform a read using Vrc to again determine the state of the cell in question. That is, the system applies Vrc to the selected word line and performs a read operation to determine whether the threshold voltage of the memory cells are above or below Vrc. If the memory cell conducts (step 1512), then, in step 1514 the system writes a "0" to the UP Latch before exiting the process in step 1518. If the channel of a memory cell conducts when the control gate of the memory cell is at Vrc, then the memory cell is either in state A or state B, and in either case the Upper Page takes the value "0", as shown in FIG. 9. However, the system writes a "1" to the UP latch in step 1516 if the memory cell does not conduct in response to Vrc at the control gate, since if the channel of a memory cell does not conduct even when the control gate of the memory cell is at Vrc then the memory cell is in state C, corresponding to two-bit binary code "01."

Figure 16:
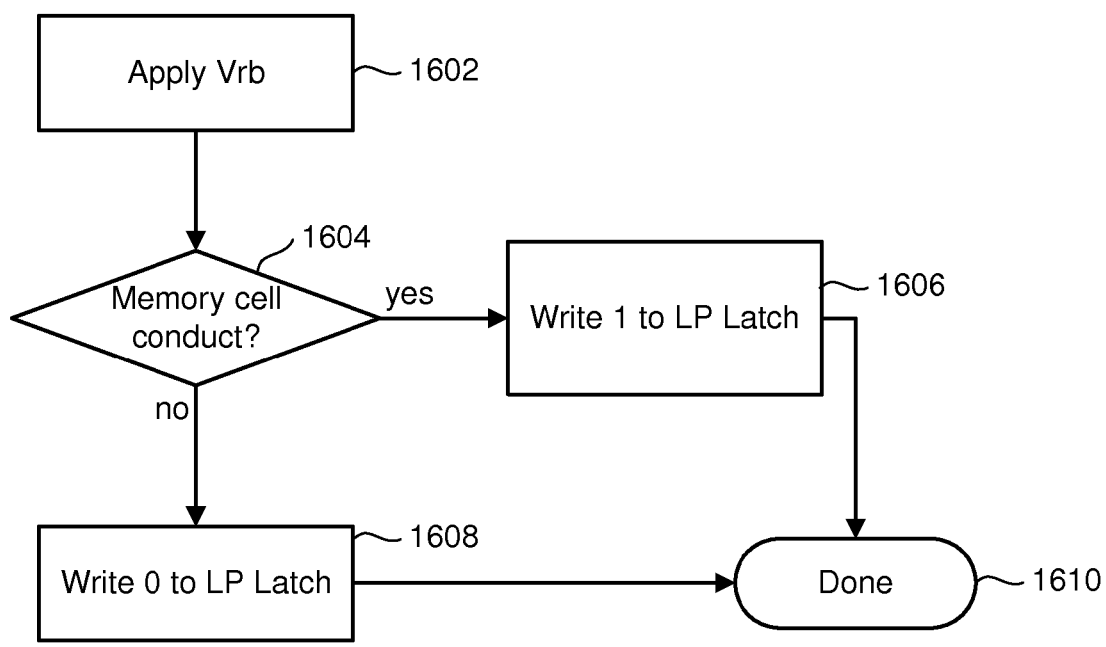
FIG. 16 is a flow chart describing one embodiment of a process for reading the lower page on a memory cell.

FIG. 16 is a flow chart describing a process for reading the lower page on a memory cell. The process of FIG. 16 is one example implementation of step 1404 of FIG. 14. In step 1602, the memory system performs a read operation by applying the voltage level Vrb to the selected word line in order to determine whether the lower page is a "1" or a "0". By applying Vrc to the selected word line, the control gates will be at Vrc and a read operation will be performed to determine whether the threshold voltage of the memory cells in below Vrc. If a memory cell conducts in response to Vrc (step 1604), then in step 1606 the system stores a "1" bit on the latch associated with the Lower Page (LP Latch). If the channel of a memory cell conducts when the control gate of the memory cell is at Vrb, then the memory cell is either in state E or A, and in either case the Lower Page data value "1", as depicted in FIG. 9. The LP Latch into which the page value is stored may be located with the other data latches in block 494 of FIG. 5. If the memory cell does not conduct, then in step 1608, the system writes a "0" to the LP Latch. After step 1606 or step 1608 is completed, the system exits the process in step 1610.

Figure 17:
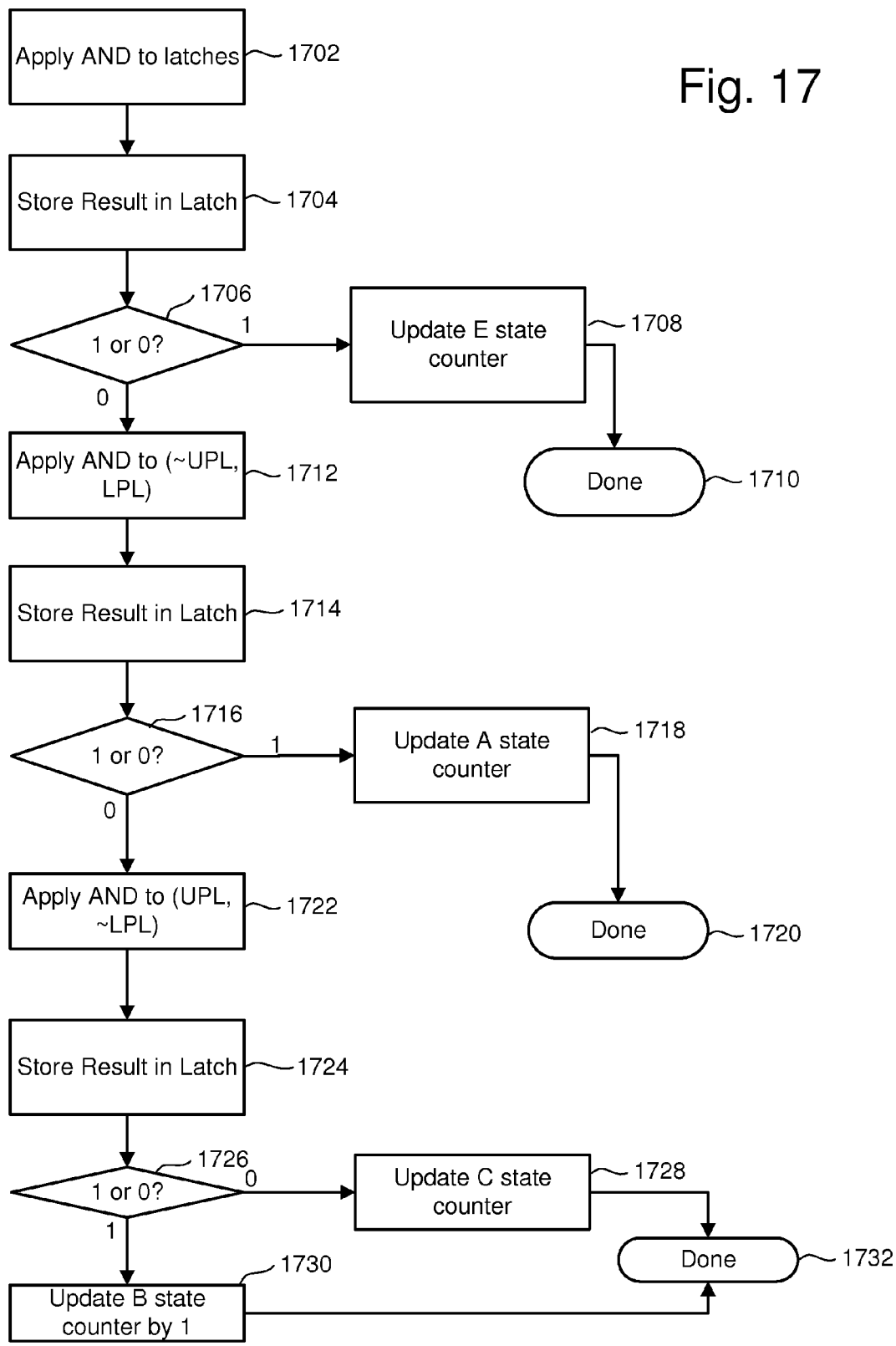
FIG. 17 is a flow chart describing one embodiment of a process for using data from memory cell reads in order to determine the distribution of cells among the various possible states.

FIG. 17 is a flow chart describing a process for using data from memory cell reads in order to determine the distribution of cells among the various possible states. The process of FIG. 17 is one example implementation of steps 1406 and 1408 in FIG. 14. In one embodiment, the process of FIG. 17 determines (for each set of read compare voltages of the plurality of different sets of read compare voltages) how many memory cells are in each data state based on the first page read and a second page read for the respective set of read compare voltages. In one example implementation, this includes, for at least a subset of data states, performing a logical operation on both bits of data for the non-volatile storage elements to determine results which indicate whether respective non-volatile storage element are in a state being tested for and counting the results for at least the subset of data states.

While the following description will apply to memory cells that store two bits of data, the process can be modified to accommodate memory cells that store any number of bits. In step 1702, the system applies the AND logical operation to the pair of latches storing the upper and lower pages of a given memory cell, the latches storing the results of the read processes described in FIGS. 15 and 16. In step 1704, the system stores the output of the AND operation in a result data latch (R Latch), possibly located among the latches in block 494 of FIG. 5. That is R Latch=UP Latch AND LP Latch. If the AND operation returns a "1" (step 1706), then both latches (UP Latch and LP Latch) stored a "1," which corresponds to an erased state (E). This determination is made for each memory cell being read, and then the system counts the number of memory cells in the E state (step 1708). In one embodiment, the memory chip will have a counter that counts all of the R Latches indicating that the respective memory cell is in E state. In another embodiment, the memory system moves the data from all of the R Latches to the Controller, the Controller counts the number of memory cells sensed to be in E state and stores the data in the Distribution Database. After performing step 1708, the process is complete (step 1710).

If the AND operation of step 1702 returns "0" (step 1706), then in step 1712 the system applies an AND operation to the Lower Page latch and the inverse of the Upper Page. The result of the AND operation is stored in the Result Latches, such that for each bit R Latch=~UP Latch AND LP Latch. If the result of the AND operation of step 1712 is a 1 (step 1716), then the respective memory cell is in state A. This determination is made for each memory cell being read, and then the system counts the number of memory cells in state A (step 1718). In one embodiment, the memory chip will have a counter that counts all of the R Latches indicating that the respective memory cell is in state A. In another embodiment, the memory system moves the data from all of the R Latches to the Controller, the Controller counts the number of memory cells sensed to be in state A and stores the data in the Distribution Database. After performing step 1718, the process is complete (step 1720).

If the AND operation of step 1712 returns "0" (step 1716), then in step 1722 the system applies an AND operation to the inverse of Lower Page latch and the Upper Page Latch. The result of the AND operation is stored in the Result Latches, such that for each bit R Latch=UP Latch AND~LP Latch. If the result of the AND operation of step 1722 is a 0 (step 1726), then the respective memory cell is in state C. This determination is made for each memory cell being read, and then the system counts the number of memory cells in state C (step 1728). In one embodiment, the memory chip will have a counter that counts all of the R Latches indicating that the respective memory cell is in state A. In another embodiment, the memory system moves the data from all of the R Latches to the Controller, the Controller counts the number of memory cells sensed to be in state A and stores the data in the Distribution Database. After performing step 1728, the process is complete (step 1732).

If the result of the AND operation of step 1722 is a 01(step 1726), then the respective memory cell is in state B. This determination is made for each memory cell being read, and then the system counts the number of memory cells in state B (step 1730). In one embodiment, the memory chip will have a counter that counts all of the R Latches indicating that the respective memory cell is in state A. In another embodiment, the memory system moves the data from all of the R Latches to the Controller, the Controller counts the number of memory cells sensed to be in state A and stores the data in the Distribution Database. After performing step 1730, the process is complete (step 1732).

Note that in some embodiments, step 1728 will not be performed. In this embodiment, the system counts memory cells in states E, A, and B. The system can then calculate the number of memory cells in states C as C=(Total Number of Memory cells Read)−(number of memory cells in states E+number of memory cells in state A+number of memory cells in state B).

The process of FIG. 17 is performed for all of the memory cells read at each iteration of the process of FIG. 14 so that at the end of the process of FIG. 14, the Distribution Database indicates how many memory cells are detected to be in each of states E, A, B and C for each of the X sets of read compare values used.

In one embodiment, the data in the Distribution Database is used to determine the threshold voltage distribution. One example method involves dividing the threshold voltage window (the range of threshold voltages for states E-C) into "bins" having an upper bound and a lower bound. Each bin will be assigned a magnitude corresponding to the number of memory cells having a threshold voltage between the upper bound and the lower bound. That is the magnitude indicates the number of memory cells that are not turned on by the lower bound at its control gate, but are turned on by the upper bound at its control gate.

Figure 18:
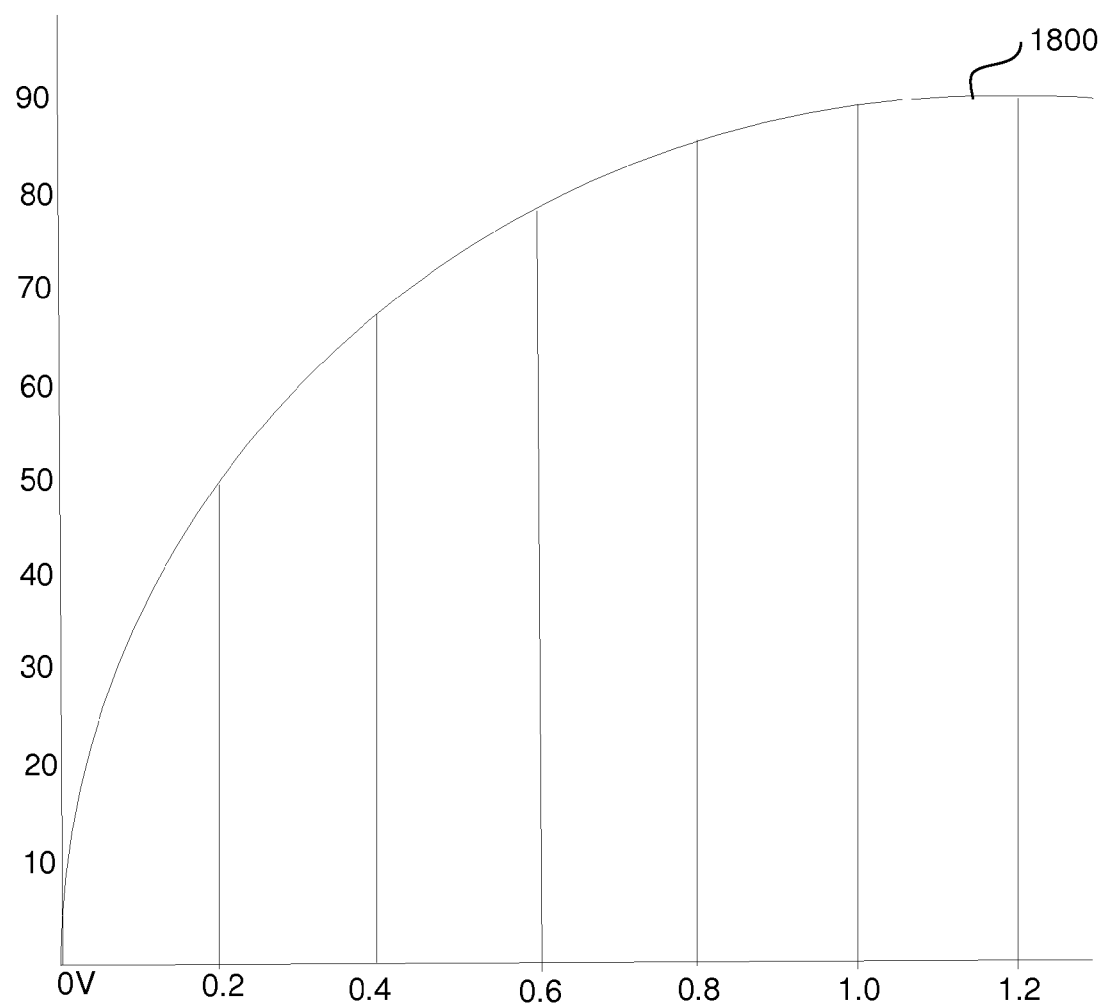
FIG. 18 is a graph depicting an exemplary distribution of the number of memory cells whose threshold voltages fall within a set of specified voltage ranges.

FIG. 18 is a graph depicting a portion of a threshold voltage distribution. This graph may represent a portion of a threshold voltage distribution of memory cells depicted in FIG. 8C. The vertical axis of the graph represents the number of memory cells, and the horizontal axis represents the threshold voltage. While curve 1800 is an idealized continuous distribution, in practice curve 1800 may represent a trend line connecting discrete data points.

Step 1312 of FIG. 13, dynamically determining the threshold voltage distribution, includes determining the magnitude of each bin so that the full graph of FIG. 18 is created. This is accomplished by first performing the process of FIG. 14 (for each set of read compare voltages of a plurality of different sets of read compare voltages, performing multiple sensing operations that each sense a different page of data from a population of non-volatile storage elements) to create the Distribution Database and then using the following example equations in Table 1 for computing the magnitudes of the bins from the data contained in the Distribution Database (determining threshold voltage distributions for the population of non-volatile storage elements based on the multiple sensing operations).

Table 1 includes six columns. The first two columns indicate the lower bound (Start Voltage) and the upper bound (End Voltage) of each bin. The third column (Bin#) identifies the bin. The fourth column (Equation) is the equation for determining the magnitude of the graph for each bin. In one embodiment, the equation determines the magnitude of the center of the bin. The fifth column (Simplified Equation) is a simplified version of the fourth column.

In the equations, E0 represents the number of memory cells determined to be in state E for iteration 0 (Read Compare Voltage Counter=0) of the loop in the process of FIG. 14. Similarly, E1 represents the number of memory cells determined to be in state E for iteration 1, E2 represents the number of memory cells determined to be in state E for iteration 2, E3 represents the number of memory cells determined to be in state E for iteration 3, E4 represents the number of memory cells determined to be in state E for iteration 4, E5 represents the number of memory cells determined to be in state E for iteration 5, E6 represents the number of memory cells determined to be in state E for iteration 6, E7 represents the number of memory cells determined to be in state E for iteration 7, and E8 represents the number of memory cells determined to be in state E for iteration 8.

In the equations, A0 represents the number of memory cells determined to be in state A for iteration 0 (Read Compare Voltage Counter=0) of the loop in the process of FIG. 14. Similarly, A1 represents the number of memory cells determined to be in state A for iteration 1, A2 represents the number of memory cells determined to be in state A for iteration 2, A3 represents the number of memory cells determined to be in state A for iteration 3, A4 represents the number of memory cells determined to be in state A for iteration 4, A5 represents the number of memory cells determined to be in state A for iteration 5, A6 represents the number of memory cells determined to be in state A for iteration 6, A7 represents the number of memory cells determined to be in state A for iteration 7, and A8 represents the number of memory cells determined to be in state A for iteration 8.

In the equations, B0 represents the number of memory cells determined to be in state B for iteration 0 (Read Compare Voltage Counter=0) of the loop in the process of FIG. 14. Similarly, B1 represents the number of memory cells determined to be in state B for iteration 1, B2 represents the number of memory cells determined to be in state B for iteration 2, B3 represents the number of memory cells determined to be in state B for iteration 3, B4 represents the number of memory cells determined to be in state B for iteration 4, B5 represents the number of memory cells determined to be in state B for iteration 5, B6 represents the number of memory cells determined to be in state B for iteration 6, B7 represents the number of memory cells determined to be in state B for iteration 7, and B8 represents the number of memory cells determined to be in state B for iteration 8.

In the equations, C0 represents the number of memory cells determined to be in state C for iteration 0 (Read Compare Voltage Counter=0) of the loop in the process of FIG. 14. Similarly, C1 represents the number of memory cells determined to be in state C for iteration 1, C2 represents the number of memory cells determined to be in state C for iteration 2, C3 represents the number of memory cells determined to be in state C for iteration 3, C4 represents the number of memory cells determined to be in state C for iteration 4, C5 represents the number of memory cells determined to be in state C for iteration 5, C6 represents the number of memory cells determined to be in state C for iteration 6, C7 represents the number of memory cells determined to be in state C for iteration 7, and C8 represents the number of memory cells determined to be in state C for iteration 8.

TABLE 1

| Start Voltage | End Voltage | Bin # | Equation | Simplified Equation |
|---|---|---|---|---|
| 0.0 V | 0.2 V | K0 = | E1 − E0 = | E1 − E0 |
| 0.2 V | 0.4 V | K1 = | E2 − E1 = | E2 − E1 |
| 0.4 V | 0.6 V | K2 = | E3 − E2 = | E3 − E2 |
| 0.6 V | 0.8 V | K3 = | E4 − E3 = | E4 − E3 |
| 0.8 V | 1.0 V | K4 = | E5 − E4 = | E5 − E4 |
| 1.0 V | 1.2 V | K5 = | E6 − E5 = | E6 − E5 |
| 1.2 V | 1.4 V | K6 = | E7 − E6 = | E7 − E6 |
| 1.4 V | 1.6 V | K7 = | E8 − E7 = | E8 − E7 |
| 1.6 V | 1.8 V | K8 = | E0 + A0 − E8 = | E0 + A0 − E8 |
| 1.8 V | 2.0 V | K9 = | A1 − A0 + E1 − E0 = | A1 − A0 + K0 |
| 2.0 V | 2.2 V | K10 = | A2 − A1 + E2 − E1 = | A2 − A1 + K1 |
| 2.2 V | 2.4 V | K11 = | A3 − A2 + E3 − E2 = | A3 − A2 + K2 |
| 2.4 V | 2.6 V | K12 = | A4 − A3 + E4 − E3 = | A4 − A3 + K3 |
| 2.6 V | 2.8 V | K13 = | A5 − A4 + E5 − E4 = | A5 − A5 + K4 |
| 2.8 V | 3.0 V | K14 = | A6 − A5 + E6 − E5 = | A6 − A5 + K5 |
| 3.0 V | 3.2 V | K15 = | A7 − A6 + E7 − E6 = | A7 − A6 + K6 |
| 3.2 V | 3.4 V | K16 = | A8 − A7 + E8 − E8 = | A8 − A7 + K7 |
| 3.4 V | 3.6 V | K17 = | E0 + A0 + B0 − (E8 + A8) = | B0 − A8 + K8 |
| 3.6 V | 3.8 V | K18 = | B1 − B0 + A1 − A0 + (E1 − E0) = | B1 − B0 + K9 |
| 3.8 V | 4.0 V | K19 = | B2 − B1 + A2 − A1 + (E2 − E1) = | B2 − B1 + K10 |
| 4.0 V | 4.2 V | K20 = | B3 − B2 + A3 − A2 + (E3 − E2) = | B3 − B2 + K11 |
| 4.2 V | 4.4 V | K21 = | B4 − B3 + A4 − A3 + (E4 − E3) = | B4 − B3 + K12 |
| 4.4 V | 4.6 V | K22 = | B5 − B4 + A5 − A4 + (E5 − E4) = | B5 − B4 + K13 |
| 4.6 V | 4.8 V | K23 = | B6 − B5 + A6 − A5 + (E6 − E5) = | B6 − B5 + K14 |
| 4.8 V | 5.0 V | K24 = | B7 − B6 + A7 − A6 + (E7 − E6) = | B7 − B6 + K15 |
| 5.0 V | 5.2 V | K25 = | B8 − B7 + A8 − A7 + (E8 − E7) = | B8 − B7 + K16 |
| 5.2 V | 5.4 V | K26 = | E0 + A0 + B0 + C0 − (E8 + A8 + B8) = | C0 − B8 + K17 |
| 5.4 V | 5.6 V | K27 = | C1 − C0 + B1 − B0 + A1 − A0 + (E1 − E0) = | C1 − C0 + K18 |
| 5.6 V | 5.8 V | K28 = | C2 − C1 + B2 − B1 + A2 − A1 + (E2 − E1) = | C2 − C1 + K19 |
| 5.8 V | 6.0 V | K29 = | C3 − C2 + B3 − B2 + A3 − A2 + (E3 − E2) = | C3 − C2 + K20 |
| 6.0 V | 6.2 V | K30 = | C4 − C3 + B4 − B3 + A4 − A3 + (E4 − E3) = | C4 − C3 + K21 |
| 6.2 V | 6.4 V | K31 = | C5 − C4 + B5 − B4 + A5 − A4 + (E5 − E4) = | C5 − C4 + K22 |
| 6.4 V | 6.6 V | K32 = | C6 − C5 + B6 − B5 + A6 − A5 + (E6 − A5) = | C6 − C5 + K23 |
| 6.6 V | 6.8 V | K33 = | C7 − C6 + B7 − B6 + A7 − A6 + (E7 − E6) = | C7 − C6 + K24 |
| 6.8 V | 7.0 V | K34 = | C8 − C7 + B7 − B6 + A7 − A6 + (E7 − E6) = | C8 − C7 + K25 |

The above set of equations are used to compute how many non-volatile storage elements are in each threshold voltage bin based on how many non-volatile storage elements were determined to be in each data state for different sets of read compare voltages. In the example of Table 1, there are thirty five bins. Therefore, there are thirty five equations that determine thirty five data points corresponding to number of memory cells in bins.

One example result of step 1312 of FIG. 13, including the result from applying the equations of Table 1 is depicted as curve 1820 in FIG. 18A. That is, the equations above yield curve 1820. The linear X axis corresponds to threshold voltage and the logarithmic Y axis corresponds to the number of memory cells in each bin. Curve 1822 of FIG. 18A shows a smoothed version of curve 182. FIG. 18B depicts the derivative of distribution function 1822 with respect to threshold voltage. Points 1830 and 1832 of FIG. 18B are two examples of zero crossings from negative values to positive values. In one embodiment, the zero crossings are obtained by interpolation between pairs of neighbor derivative data. More information about zero crossing are provided below.

Note that FIGS. 18A and 18B show data for an example when the memory cells store four bits of data each; therefore, there are sixteen data states. Most of the examples discussed above show the memory cells storing two bits of data each. However, the teachings of FIGS. 18A and 18B apply memory cells storing one bit of data, two bits of data, three bits of data, four bits of data, etc.

Figure 18C:
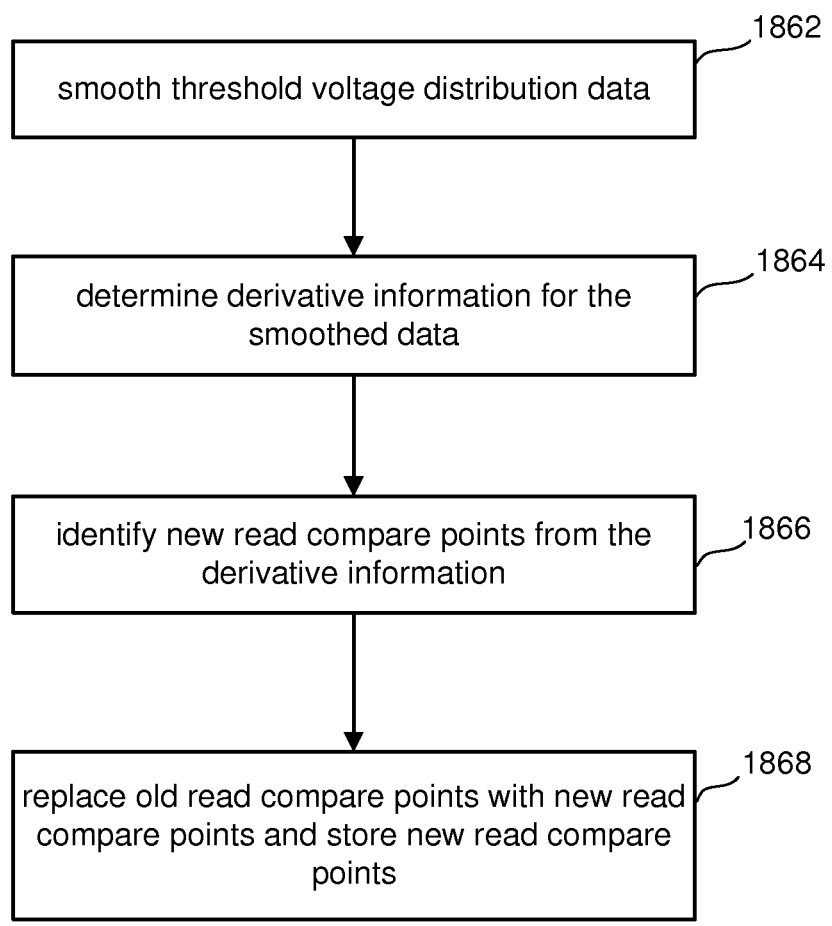
FIG. 18C is a flow chart that describes one embodiment of a process for updating read compare levels.

FIG. 18C is a flow chart that describes an embodiment of a process for updating read compare levels (step 1314 of FIG. 13). The process of FIG. 18C may be performed after the threshold voltage distribution is determined in step 1312 of FIG. 13. In one embodiment, the threshold voltage distribution data is determined for all memory cells connected to a single word line, all memory cells in a block, all memory cells in an array of memory cells, or another unit of memory cells. In one example, the input to the process of FIG. 18C is curve 1820. Other types and forms of threshold voltage distribution data can also be used. In step 1862, the threshold voltage distribution data is smoothed. For example, curve 1820 is smoothed to create curve 1822 of FIG. 18A. Any one of many suitable known functions can be uses to smooth the threshold voltage distribution data by means of convolution or any other operations known in the art. For example, a low pass filter can be used to smooth the data. Other examples of suitable functions include Gaussian functions, truncated Gaussian functions, skewed Gaussian functions, weighted moving averages, and square functions. In step 1864 of FIG. 18C, the derivative of the smoothed data is determined. For example the graph of FIG. 18B is created. There are many ways and forms to create and store information about the derivative, with no one particular way or form required. In step 1866, the output of derivative calculation is investigated to look for zero crossings. In one embodiment, zero crossings of the derivative data from negative derivative data values transitioning to positive derivative data values, as word line voltage is increased, represent read compare points. In other embodiments, the scale, form or range of the data could be different and the process would look for other data landmarks (including crossing other thresholds) as an indication of the read compare points. In step 1868, the new read compare points found in step 1866 are used to replace the old read compare points. In one embodiment, the new read compare points are stored as parameters in registers/latches in the controller 244 or control circuitry 220 to be used immediately. In another embodiment, the new read compare points are stored as parameters in non-volatile memory for future use. The preferred type of non-volatile memory for such parameters storage is the binary type which would allow more updates as it is more immune to degradation due to program/erase cycles. However, any type of volatile or non-volatile memory for such parameters storage may be used. An alternative method of obtaining new read compare voltage values from a threshold voltage distribution is described in the following paragraph.

Consider curves 1820 or 1822 (FIG. 18A) with a linear voltage axis and a memory cell count axis in a logarithmic scale with base 10, though the logarithmic base can be another number in principle. The maxima and minima of the function may be determined in a standard way with reference to a derivative function such as that depicted in FIG. 18B. Suppose further that for a minimum in question, there is a maximum on either side of the minimum point (on the voltage axis). Then the distance (along the log count axis) between the minimum and each maximum can be divided into approximately even thirds, a processor in the system performing the requisite mathematical calculations to create these divisions. It is known that dividing a path between two points into three segments requires two intermediate points. Thus, there are two pairs of intermediate points, one for each maximum. Each of these pairs of points, as per Euclidean geometry, can be used to construct a line, such that there are two lines, each between the minimum and one of the maxima. These lines may be represented as high-resolution tables of coordinate pairs in the system. The system can then perform further mathematical operations to find an approximate intersection between the two lines, which are known to intersect between the maxima and near the minimum. The digital value nearest to this intersection point (and representable by the system), once stored, can be used to generate the new read compare voltage, perhaps by means of a Digital-to-Analog Converter (DAC). The read compare voltages for the different states, as determined here or using other methods, may be differently separated [i.e. (Vrc−Vrb) may differ from (Vrb−Vra)], as the electron leakage conditions from the various memory cells and for the different data states may require. The new read compare voltages that may replace the previous read compare voltages may correspond to the voltages at the center of the bins as shown in the table describing FIG. 18.

The process of FIG. 18C can be completely performed on memory chip 212 (e.g., at the direction of state machine 222) or it can be performed by a combination of memory chip 212 and controller 244. In one implementation, the controller issues a command to the state machine to update the read compare points. In another implementation, the state machine determines when to update the read compare points. In one example, the controller requests the threshold voltage distribution data from the memory chip 212 and then the controller issues commands to the memory, receives data from memory that allows it to perform steps 1862-1868. Other divisions of labor can also be used.

Figure 19:
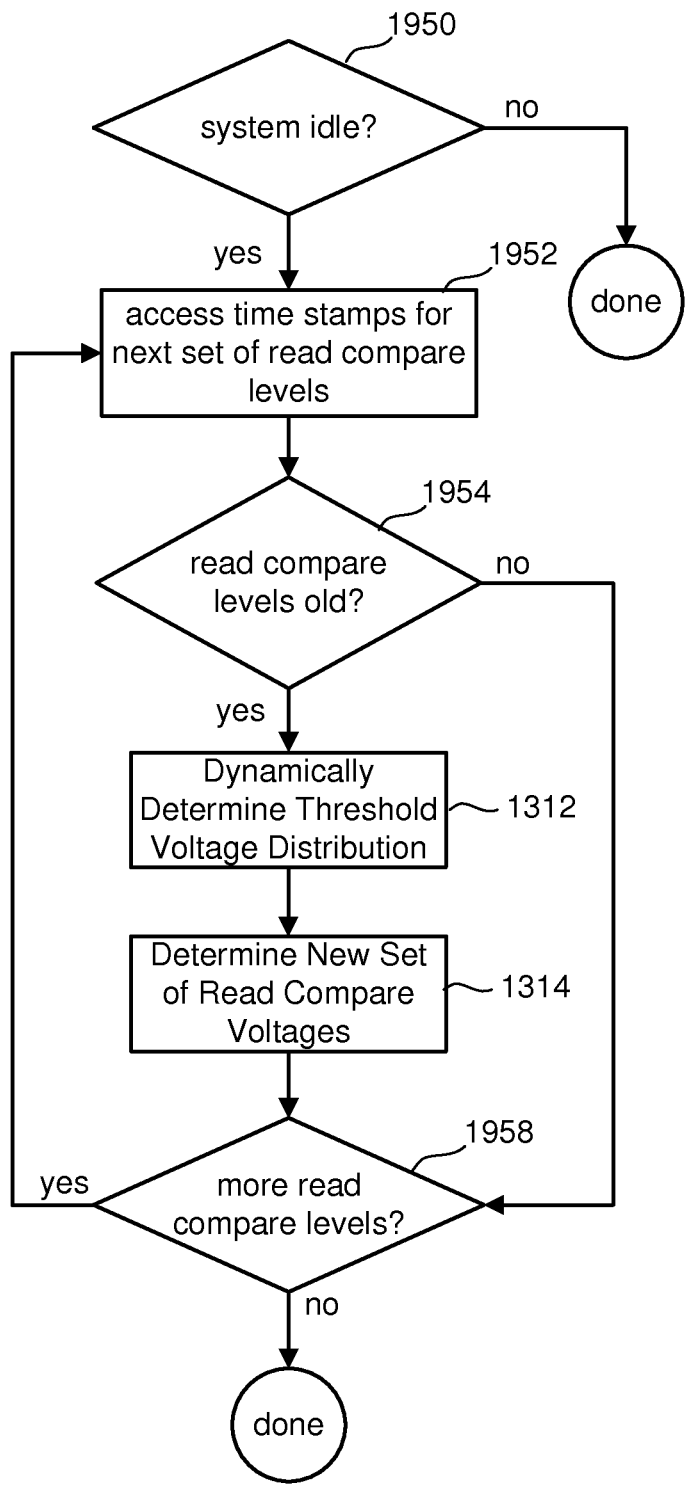
FIG. 19 is a flow chart describing one embodiment of a process performed for updating a non-volatile memory system during idle time.

FIG. 19 is a flow chart describing a process for updating the read compare points (e.g., Vra, Vrb and Vrc) periodically when the memory system has idle time or can otherwise perform the operation without materially affecting user perceived performance. The process of FIG. 19 can be performed periodically or continuously. Whereas the process of FIG. 13 may be executed when the system performs a read operation.

In step 1950 of FIG. 19, the state machine (or controller, or other device) will determine whether the memory system is idle. If not, the method of FIG. 19 is completed. If the memory system is idle, then a time stamp for the next set of read compare points is accessed. In one embodiment, there is one set of read compare points for the entire system. In another embodiment, each block, word line or other unit of data will have its own set of read compare points and each set will have its own time stamp. The first time that step 1952 is performed, a time stamp for any of the various sets of read compare points is accessed. Each subsequent iteration of step 1952 during a performance of the process of FIG. 19 will access another set of time stamps for another word line, block, etc. In one embodiment, multiple sets of read compare points can share a common time stamp.

In step 1954 of FIG. 19, the system will determine if the accessed time stamp indicates that the associated read compare points are older than a predetermined threshold (e.g., two weeks, two months, etc.). If so, then the system executes steps 1312 and 1314 from FIG. 13, in which the set of read compare points associated with the currently chosen time stamp are updated after determining the threshold voltage distribution over these memory cells, using the methods described above. If the accessed read compare points are not older than the predetermined threshold, then steps 1312 and 1314 skipped. In step 1958, it is determined whether there are more sets of read compare levels. If there are more sets of read compare levels that need to be considered, then the process loops back to step 1952 and the next time stamp for the next set of read compare levels is processed. If there are no more sets of read compare levels that need to be considered in this performance of the method of FIG. 19, then the method of FIG. 19 is completed.

One set of read compare points can be obtained per word line. The memory cells (or a subset of the memory cells) that reside on one word line can form one or more ECC pages. A portion (e.g. one quarter) of the memory cells that reside on the same word line may constitute a page. In one embodiment, one set of read compare points per word line will be appropriate for all the pages on that word line. To save time, the same set of read compare points obtained on one word line may be used on all other word lines in the same block. If information about the time of the last update of the read compare points for a given page is not available, then the rate at which the read compare points are updated in the background can be adjusted such that no word line's read compare points are updated more often than a predetermined amount of time even if the memory system is continuously powered up and idle.

Figure 19A:
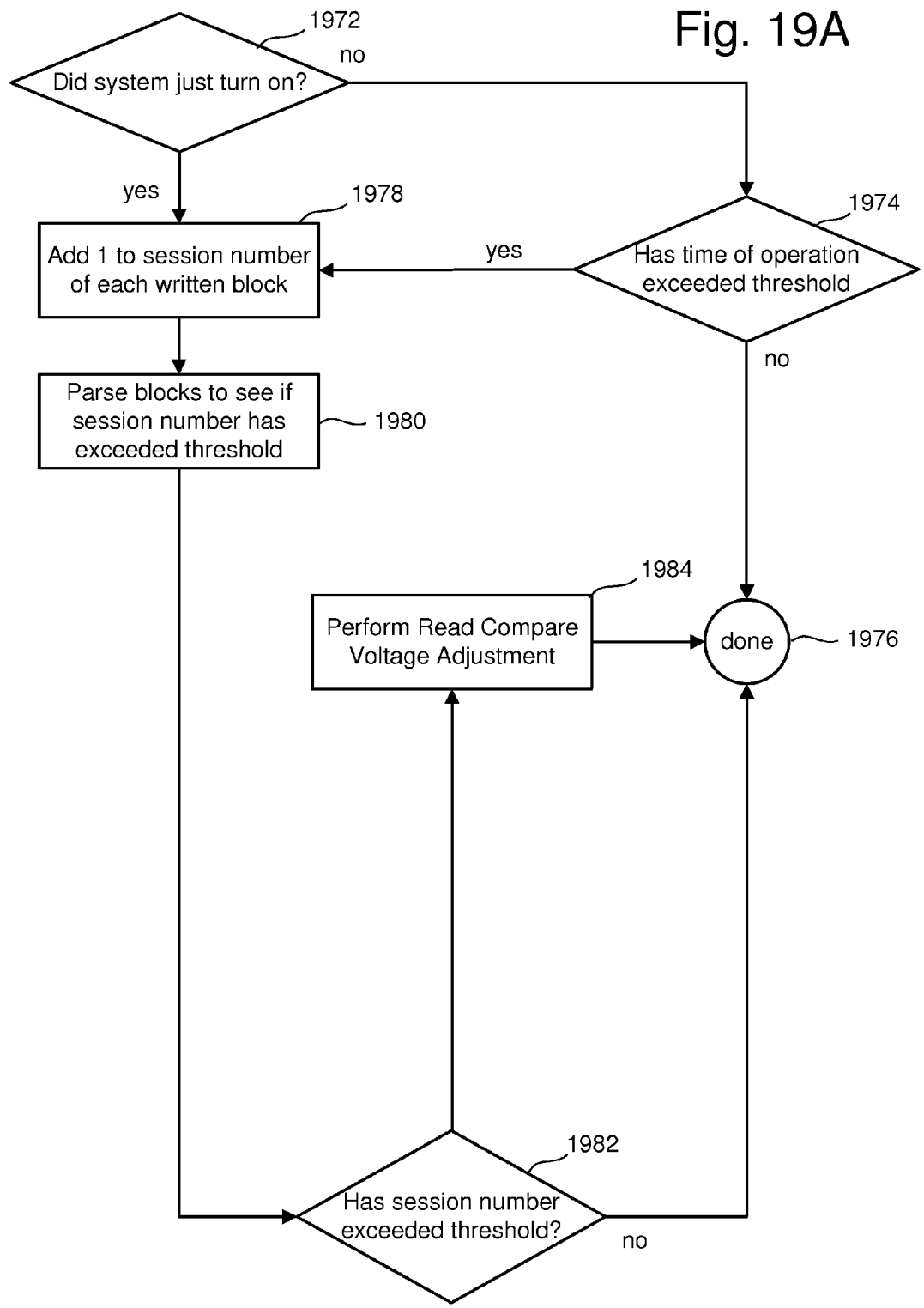
FIG. 19A is a flow chart describing one embodiment of a process to periodically adjust read compare voltages for nonvolatile memory elements.

FIG. 19A is a flow chart describing one process to periodically adjust read compare voltages for nonvolatile memory elements. The process of FIG. 19A may be employed to account for gradual change of state in memory cells, which in some cases may be the result of electrons leaking from the floating gate. The process of FIG. 19A represents an alternative to the process of FIG. 19 that adjusts read compare voltages according to the number of times a block has been programmed, rather than according to a certain period of time that has passed. In step 1972, which may be triggered every clock cycle on one or more of the system processors, the system will check whether or not the memory chip has been recently activated. If not, and the memory has been "on" for a certain duration of time, then in step 1974, the system checks whether this duration has exceeded a threshold, which may be days or weeks of sustained operation. In some embodiments, the threshold of time may be fixed, while in others, periodic temperature readings may be used to dynamically calculate this threshold, since heating may cause depletion of stored charge. If the duration of operation has not surpassed this threshold, the system will exit the process in step 1976.

However, if, in step 1972, the system determines that it has just turned on, or, if in step 1974, the duration of operation has surpassed the threshold used by the system, then in step 1978, the system adds 1 to the session number of each programmed block. Here, session number refers to the number of sessions for which a block has been programmed, and a session is a period of time during which the memory circuit remains operational without turning off. Thus, for a block, the number of sessions is 0 until it is programmed, after which it is changed to 1, 2, 3, etc., as the memory system is used.

After step 1978, the system checks each block in step 1980 to determine if the block has been programmed for more than a certain number of sessions, since after a certain number of sessions, the threshold voltages on the memory cells may drift due to various random processes. In step 1982, if, for a given block, the session number has exceeded a certain threshold, the system moves on to step 1984, in which, for this block, the system employs any of the aforementioned methods for adjusting the read compare voltage. If, after step 1982, no adjustment is needed, or after step 1984 has completed for all blocks having been programmed for a certain number of sessions, the system finishes the process in step 1976. In some embodiments, the session number is reset to 0 for any block having undergone read compare voltage adjustment in step 1984.

The above paragraphs explain a system and methods to determine the distribution of threshold voltages among a set of nonvolatile memory cells and use the distribution data to determine new read compare voltages while ensuring adequate separation between the possible data states.

One embodiment comprises a method for operating a non-volatile storage device, comprising, for each set of read compare voltages of a plurality of different sets of read compare voltages, performing multiple sensing operations that each sense a different page of data from a population of non-volatile storage elements and determining threshold voltage distributions for the population of non-volatile storage elements based on the multiple sensing operations.

One embodiment comprises a non-volatile storage apparatus comprising a population of non-volatile storage elements and one or more managing circuits in communication with the population of non-volatile storage elements, for each set of read compare voltages of a plurality of different sets of read compare voltages, the one or more managing circuits perform multiple sensing operations that each sense a different page of data from a population of non-volatile storage elements, and the one or more managing circuits determine threshold voltage distributions for the population of non-volatile storage elements based on the multiple sensing operations.

One embodiment comprises a method for operating a non-volatile storage device, comprising performing multiple sensing operations for a population of non-volatile storage elements, the multiple sensing operations comprise applying a read compare voltage to a selected non-volatile storage element, applying a particular voltage to a neighbor of the selected non-volatile storage element based on a current condition of the neighbor while applying the read compare voltage to a selected non-volatile storage element and sensing a condition of the selected non-volatile storage element, and determining threshold voltage distributions for the population of non-volatile storage elements based on the multiple sensing operations.

One embodiment comprises a method for operating a non-volatile storage device, comprising determining threshold voltage distributions for a population of non-volatile storage elements by performing a first type of read process using at least a first set of read compare voltages, determining a new set of read compare voltages for distinguishing between threshold voltage distributions based on the determined threshold voltage distributions, and reading data from the population of non-volatile storage elements by the first type of read process using the new set of read compare voltages.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a non-volatile storage device, comprising:
   determining threshold voltage distributions for a population of non-volatile storage elements by performing a first type of read process using at least a first set of read compare voltages;
   determining a new set of read compare voltages for distinguishing between threshold voltage distributions based on the determined threshold voltage distributions; and
   reading data from the population of non-volatile storage elements by the first type of read process using the new set of read compare voltages.

2. The method of claim 1, wherein:
   the first type of read process comprise applying a current read compare voltage to a selected non-volatile storage element, applying a particular voltage to a neighbor of the selected non-volatile storage element based on a current condition of the neighbor while applying the current read compare voltage to a selected non-volatile storage element and sensing a condition of the selected non-volatile storage element.

3. The method of claim 2, wherein the current condition of the neighbor is whether or not current is flowing through a bit line connected to the neighbor when a read compare voltage is applied to a word line shared by the neighbor and the selected non-volatile storage element.

4. The method of claim 1 wherein determining threshold voltage distributions for the population of non-volatile storage elements by performing a first type of read process using at least a first set of read compare voltages further comprises:
   determining how many non-volatile storage elements are in each data state of a set of data states for at least the first set of read compare voltages, each data state is represented by a number of bits of data;
   the determining how many non-volatile storage elements are in each data state further comprises, for at least a subset of data states, performing a logical operation on the number of bits of data for the non-volatile storage elements to determine results which indicate whether respective non-volatile storage elements are in a data state being tested for, and counting the results for at least the subset of data states.

5. The method of claim 4, wherein determining threshold voltage distributions for the population of non-volatile storage elements by performing a first type of read process using at least a first set of read compare voltages further comprises:
   computing how many non-volatile storage elements are in each threshold voltage bin based on how many non-volatile storage elements were determined to be in each data state for at least the first set of read compare voltages.

6. The method of claim 1, wherein determining a new set of read compare voltages for distinguishing between threshold voltage distributions based on the determined threshold voltage distributions further comprises:
   smoothing the threshold voltage distribution data;
   determining derivative information for the smoothed data;
   identifying new read compare voltages from the derivative information; and
   storing the new read compare voltages in memory.

7. The method of claim 2, wherein determining a new set of read compare voltages for distinguishing between threshold voltage distributions based on the determined threshold voltage distributions further comprises:
   smoothing the threshold voltage distribution data;
   determining derivative information for the smoothed data;
   identifying new read compare voltages from the derivative information, the identifying new read compare voltages from the derivative information further comprises identifying zero crossings representing the new read compare voltages in the smoothed derivative data including interpolating between pairs of neighbor derivative data to obtain the zero crossings; and
   storing the new read compare voltages in memory.

8. The method of claim 1, wherein the population of non-volatile storage elements are flash memory cells in a same memory block.

9. A non-volatile storage apparatus, comprising:
   a population of non-volatile storage elements; and
   one or more managing circuits in communication with the population of non-volatile storage elements, the one or more managing circuits configured to determine threshold voltage distributions for the population of non-volatile storage elements by the one or more managing circuits performing a first type of read process using at least a first set of read compare voltages;
   the one or more managing circuits configured to determine a new set of read compare voltages for distinguishing between threshold voltage distributions based on the determined threshold voltage distributions; and
   the one or more managing circuits configured to read data from the population of non-volatile storage elements by the first type of read process using the new set of read compare voltages.

10. The non-volatile storage apparatus of claim 9, wherein:
    the one or more managing circuits performing the first type of read process further comprises applying a current read compare voltage to a selected non-volatile storage element, applying a particular voltage to a neighbor of the selected non-volatile storage element based on a current condition of the neighbor while applying the current read compare voltage to a selected non-volatile storage element and sensing a condition of the selected non-volatile storage element.

11. The non-volatile storage apparatus of claim 10, wherein the current condition of the neighbor is whether or not current is flowing through a bit line connected to the neighbor when a read compare voltage is applied to a word line shared by the neighbor and the selected non-volatile storage element.

12. The non-volatile storage apparatus of claim 9 wherein the one or more managing circuits configured to determine threshold voltage distributions for the population of non-volatile storage elements by performing a first type of read process using at least a first set of read compare voltages further comprises:

the one or more managing circuits further configured to determine how many non-volatile storage elements are in each data state of a set of data states for at least the first set of read compare voltages, each data state is represented by a number of bits of data;

the one or more managing circuits further configured to determine how many non-volatile storage elements are in each data state further comprises the one or more managing circuits being further configured to, for at least a subset of data states, perform a logical operation on the number of bits of data for the non-volatile storage elements to determine results which indicate whether respective non-volatile storage elements are in a data state being tested for, and counting the results for at least the subset of data states.

13. The non-volatile storage apparatus of claim 12, wherein the one or more managing circuits configured to determine threshold voltage distributions for the population of non-volatile storage elements by performing a first type of read process using at least a first set of read compare voltages further comprises:

the one or more managing circuits configured to compute how many non-volatile storage elements are in each threshold voltage bin based on how many non-volatile storage elements were determined to be in each data state for at least the first set of read compare voltages.

14. The non-volatile storage apparatus of claim 9, wherein the one or more managing circuits configured to determine A new set of read compare voltages for distinguishing between threshold voltage distributions based on the determined threshold voltage distributions further comprises the one or more managing circuits being further configured to:

smooth the threshold voltage distribution data;
determine derivative information for the smoothed data;
identify new read compare voltages from the derivative information; and
store the new read compare voltages in memory.

15. The non-volatile storage apparatus of claim 14, wherein the one or more managing circuits configured to identify new read compare voltages from the derivative information further comprises the one or more managing circuits configured to identify zero crossings in the smoothed derivative data from negative derivative data values transitioning to positive derivative data values, as word line voltage is increased for one or more word lines to which the population of non-volatile storage elements are connected, the one or more managing circuits are configured to interpolate between pairs of neighbor derivative data to obtain the zero crossing.

16. The non-volatile storage apparatus of claim 9 wherein data values associated with the threshold voltage bins have been assigned using a Gray code assignment.

17. The non-volatile storage apparatus of claim 13 further comprising:

a memory accessible to a memory controller of the one or more managing circuits for storing a distribution database which stores data indicating how many non-volatile storage elements were determined to be in each data state for each of the different sets of read compare voltages; and the one or more managing circuits being further configured to compute how many non-volatile storage elements are in each threshold voltage bin based on how many non-volatile storage elements were determined to be in each data state for at least the first set of read compare voltages based on the data stored in the distribution database.

18. The non-volatile storage apparatus of claim 17 wherein how many non-volatile storage elements are computed to be in each threshold voltage bin is computed by determining a magnitude indicating a number of non-volatile storage elements that are not turned on by a lower bound voltage of a respective threshold voltage bin but are turned on by an upper bound voltage of the respective threshold voltage bin.

* * * * *